(12) United States Patent
Hsu et al.

(10) Patent No.: US 8,943,651 B2
(45) Date of Patent: Feb. 3, 2015

(54) CONNECTING DEVICE CAPABLE OF OPENING AND ENGAGING IN DUAL DIRECTIONS

(71) Applicant: Jarllytec Co., Ltd., New Taipei (TW)

(72) Inventors: Yu-Tsun Hsu, New Taipei (TW); Yin-Min Yeh, New Taipei (TW)

(73) Assignee: Jarllytec Co., Ltd., New Taipei (TW)

( * ) Notice: Subject to any disclaimer, the term of this patent is extended or adjusted under 35 U.S.C. 154(b) by 0 days.

(21) Appl. No.: 14/148,663

(22) Filed: Jan. 6, 2014

(65) Prior Publication Data

US 2014/0331454 A1 Nov. 13, 2014

(30) Foreign Application Priority Data

May 10, 2013 (TW) .............................. 102116785 A
Aug. 5, 2013 (TW) .............................. 102127918 A

(51) Int. Cl.
*E05D 15/00* (2006.01)
*E05D 3/06* (2006.01)
*H05K 5/02* (2006.01)

(52) U.S. Cl.
CPC .................................. *H05K 5/0226* (2013.01)
USPC .............................................. 16/368; 16/366

(58) Field of Classification Search
CPC ... G06F 1/1616; G06F 1/1679; G06F 1/1681; H05K 5/0226; E05D 3/122; E05D 3/12; E05D 3/16; E05D 3/18; E05D 3/06; E05D 3/32; E05D 11/1021; E05D 11/1078; E05Y 2900/20; E05Y 2900/60; E05Y 2900/606; E04M 1/022; E04M 1/0214; E04M 1/0216
USPC ........... 16/327, 331, 333, 338, 340, 366, 354, 16/357, 360, 346, 345, 368, 369, 286, 291, 16/293, 294, 296; 361/679.08, 679.11, 361/679.02, 679.15, 679.27, 679.21, 361/679.09, 679.22; 455/90.3, 575.1, 455/575.3, 575.8; 379/433.12, 433.13; 348/373, 333.01, 333.06, 794; 248/274.1, 284.1, 286.1, 287.1, 419, 248/420

See application file for complete search history.

(56) References Cited

U.S. PATENT DOCUMENTS

| | | | | |
|---|---|---|---|---|
| 4,589,659 A | * | 5/1986 | Yokoi et al. | ...................... 463/34 |
| 4,859,092 A | * | 8/1989 | Makita | ........................... 400/83 |
| 4,960,256 A | * | 10/1990 | Chihara et al. | ............. 248/286.1 |
| 5,103,376 A | * | 4/1992 | Blonder | .................... 361/679.09 |
| 7,828,260 B2 | * | 11/2010 | Hauser et al. | .................. 248/456 |
| 8,102,675 B2 | * | 1/2012 | Kilpinen | ....................... 361/814 |

(Continued)

FOREIGN PATENT DOCUMENTS

| TW | M368727 | 11/2009 |
|---|---|---|
| TW | M441303 | 11/2009 |

*Primary Examiner* — Chuck Mah
(74) *Attorney, Agent, or Firm* — Guice Patents PLLC

(57) ABSTRACT

The present invention relates to a connecting device capable of opening and engaging in dual directions, which includes: a supporter; a corresponding supporter capable of being engaged with the supporter; and two connection bars parallel to each other, each of the connection bars is respectively parallel to the supporter and the corresponding supporter, and two ends of each of the connection bars are respectively pivoted with the supporter and the corresponding supporter thereby allowing the corresponding supporter to be rotated and unfolded towards an end direction of the supporter or to be rotated and unfolded towards an opposite end direction of the supporter so as to form the dual-directional opening operation.

25 Claims, 17 Drawing Sheets

(56) References Cited

U.S. PATENT DOCUMENTS

| | | | |
|---|---|---|---|
| 8,250,711 B1* | 8/2012 | Chen et al. | 16/354 |
| 8,559,623 B2* | 10/2013 | Chen et al. | 379/433.12 |
| 2004/0187262 A1* | 9/2004 | Gabathuler | 16/366 |
| 2009/0013500 A1* | 1/2009 | Ueyama et al. | 16/354 |
| 2010/0006730 A1* | 1/2010 | Hsu | 248/346.06 |
| 2011/0141737 A1* | 6/2011 | Gu et al. | 362/249.1 |
| 2012/0273448 A1* | 11/2012 | Hsu | 211/195 |
| 2012/0273449 A1* | 11/2012 | Hsu | 211/195 |
| 2012/0328222 A1* | 12/2012 | Chen et al. | 384/26 |
| 2013/0112818 A1* | 5/2013 | Hsu | 248/121 |
| 2014/0043737 A1* | 2/2014 | Chen et al. | 361/679.01 |

* cited by examiner

CONNECTING DEVICE CAPABLE OF OPENING AND ENGAGING IN DUAL DIRECTIONS

BACKGROUND OF THE INVENTION

1. Field of the Invention

The present invention relates to a connecting device capable of opening and engaging in dual directions, especially to a connecting device capable of opening and engaging in dual directions which is suitable to be applied in an electronic product equipped with a display thereby proving a dual-directional opening effect to the display; the mentioned display can be a screen or a touch screen.

2. Description of Related Art

A general electronic product is mainly composed of a screen and a machine housing (e.g. a keyboard, an image capturing device and an expansion dock), with the well-developed technology, the volume and dimension of the electronic product (e.g. a digital camera, a notebook computer or a mobile phone) is able to be reduced, and a touch screen is gradually adopted as the screen of the electronic product; so when being used, the screen (or the touch screen) is able to be horizontally rotated relative to the machine housing, or even be vertically rotated; the mechanism or device adopted for achieving the mentioned horizontal rotating operation can utilize a biaxial hinge (e.g. the thinned biaxial hinge disclosed in the Taiwan Patent No. M441303), the biaxial hinge mainly includes a frame composed of two connection sheets parallel to each other, a first rotation shaft and a second rotation shaft disposed with a parallel manner between the two connection sheets, the first and the second rotation shafts are arranged in an inclined format when being engaged to zero degree thereby allowing the thickness of the screen and the machine housing to be thinner while being engaged with each other; the mechanism or device adopted for achieving the mentioned horizontal rotating operation and the vertical rotating operation can utilize a biaxial rotating hinge (e.g. the hinge with rotation displacement function disclosed in the Taiwan Patent No. M368727), the hinge with rotation displacement function includes a supporter having a lateral sheet, three rotation shafts, two fasten racks and a fasten sheet, the three rotation shafts includes two first rotation shafts horizontally disposed on the lateral sheet of the supporter and a second rotation shaft vertically disposed on the supporter, the two fasten racks are respectively disposed at shaft ends of the two first rotation shafts, the fasten sheet is disposed at a shaft end of the second rotation shaft, and the hinge is provided with two protrusions on a mobile cam, a fixed cam is provided a first guiding piece and a second guiding piece formed with a guiding curved surface; when a screen is rotated for being opened, the supporter drives a core axis of the first rotation shaft fastened on the supporter and the mobile cam sleeved on the core axis for being synchronously rotated, so the protrusions are enabled to be moved along the guiding curved surface thereby allowing the mobile cam, the core axis and the supporter to be displaced and the screen to be gradually displaced towards outward, the distance defined between the screen and the machine housing (i.e. the main body of the machine) is increased thereby allowing the screen to be smoothly opened without being interfered by the machine housing, and a gap could be avoided from being generated between the screen and the machine housing.

SUMMARY OF THE INVENTION

The mentioned biaxial hinge disclosed in the Taiwan Patent No. M441303 and the biaxial rotating hinge disclosed in the Taiwan Patent No. M368727 both includes a frame (two connection sheets), a supporter or fasten racks, the thickness and the height of the mentioned components would occupy the installation space, so when being installed with the screen (or the touch screen) and the machine housing, a sufficient space (e.g. installation depth) is required for installing the hinge, thereby limiting the effect of making the screen (or the touch screen) and the machine housing to be thinner; on the other hand, a conventional screen can only be horizontally rotated in single direction and cannot be horizontally rotated in dual directions, so when designing a digital camera, the design flexibility is restrained by the location where the function key is installed or the desired outlook of the housing; the present invention is aimed to improve the two disadvantages mentioned above.

One primary objective of the present invention is to provide a connecting device capable of opening and engaging in dual directions, two supporters capable of being mutually engaged are designed to be respectively connected to the screen and the machine housing of an electronic product, and two connection bars parallel to each other are installed, an effect of making the connecting device in the engaged status to be thinner can be achieved, and the screen is enabled to be rotated and unfolded in two opposite directions along with the two connection bars, thereby allowing the screen to be unfolded and engaged in sequence.

Another objective of the present invention is to provide a connecting device capable of opening and engaging in dual directions having a torque varying function, by respectively installing a hinge at the location where two supporters capable of being mutually engaged and two connection bars being pivoted, an effect of being thinner is provided, and each of the connection bars is enabled to be in sequence unfolded and engaged with the corresponding supporter towards different direction, the bidirectional opening effect is also provided with the torque varying effect.

One another objective of the present invention is to provide a connecting device capable of opening and engaging in dual directions having a rotation buckling effect, a buckling structure is additionally installed between two supporters capable of being mutually engaged, when the corresponding supporter is processed with the dual-directional opening operation relative to the supporter, an effect of being thinner is provided, each connection bar is served to ensure the stability of the corresponding supporter being unfolded and engaged in sequence, a rotation buckling effect is also provided for ensuring the stability of the rotating operation, so the corresponding supporter is prevented from being loosened during the rotating operation.

For achieving said objectives, the present invention provides a connecting device capable of opening and engaging in dual directions, which includes: a supporter; a corresponding supporter capable of being engaged with the supporter; and two connection bars parallel to each other, each of the connection bars is respectively parallel to the supporter and the corresponding supporter, and two ends of each of the connection bars are respectively pivoted with the supporter and the corresponding supporter thereby allowing the corresponding supporter to be rotated and unfolded towards an end direction of the supporter or to be rotated and unfolded towards an opposite end direction of the supporter so as to form the dual-directional opening operation.

For achieving said objectives, the present invention provides a connecting device capable of opening and engaging in dual directions, which includes: a supporter having two opposite ends respectively installed with a third pivotal part and a fourth pivotal part; a corresponding supporter capable of being engaged with the supporter, two opposite ends of the corresponding supporter are respectively installed with a first pivotal part and a second pivotal part; and two connection bars parallel to each other, two ends of one of the connection bars are respectively pivoted with the first pivotal part and the third pivotal part, two ends of the other connection bar are respectively pivoted with the second pivotal part and the fourth pivotal part, so the corresponding supporter and one of the connection bars are allowed to respectively utilize the second and the third pivotal parts as a rotation axis for being rotated and unfolded towards an end direction of the supporter, or the corresponding supporter and the other connection bar are allowed to respectively utilize the first and the fourth pivotal parts as a rotation axis for being rotated and unfolded towards an opposite end direction of the supporter thereby forming the dual-directional opening operation.

For achieving said objectives, the present invention provides a connecting device capable of opening and engaging in dual directions, which includes: a supporter, installed with a third pivotal part and a fourth pivotal part arranged with an interval on a main body thereof; a corresponding supporter pivoted with the supporter and capable of being mutually engaged, and installed with a first pivotal part and a second pivotal part arranged with an interval on a main body thereof; and two connection bars parallel to each other and disposed between the supporter and the corresponding supporter capable of being mutually engaged, wherein two ends of one of the connection bars are respectively pivoted with the first pivotal part and the third pivotal part, two ends of the other connection bar are respectively pivoted with the second pivotal part and the fourth pivotal part, so the corresponding supporter and one of the connection bars are allowed to respectively utilize the second and the third pivotal parts as a rotation axis for being rotated and unfolded towards an end direction of the supporter, or the corresponding supporter and the other connection bar are allowed to respectively utilize the first and the fourth pivotal parts as a rotation axis for being rotated and unfolded towards an opposite end direction of the supporter thereby forming the dual-directional opening operation.

For achieving said objectives, the present invention provides a connecting device capable of opening and engaging in dual directions, which includes: a supporter, installed with a third pivotal part and a fourth pivotal part arranged with an interval; a corresponding supporter pivoted with the supporter and capable of being mutually engaged, and installed with a first pivotal part and a second pivotal part arranged with an interval; two hinges, parallel to each other and horizontally disposed at two opposite sides of the supporter or the corresponding supporter, so each of the hinges is respectively disposed at the third pivotal part and the fourth pivotal part, or each of the hinges is respectively disposed at the first pivotal part and the second pivotal part; and two connection bars parallel to each other and disposed at two opposite sides of the supporter and the corresponding supporter capable of being mutually engaged, wherein two ends of one of the connection bars are respectively pivoted with the first pivotal part and the third pivotal part, two ends of the other connection bar are respectively pivoted with the second pivotal part and the fourth pivotal part, so the corresponding supporter and one of the connection bars are allowed to respectively utilize the second and the third pivotal parts as a rotation axis for being rotated and unfolded towards an end direction of the supporter so as to generate a first torque variation, or the corresponding supporter and the other connection bar are allowed to respectively utilize the first and the fourth pivotal parts as a rotation axis for being rotated and unfolded towards an opposite end direction of the supporter so as to generate a second torque variation, thereby providing the torque variation to the dual-directional opening operation.

For achieving said objectives, the present invention provides a connecting device capable of opening and engaging in dual directions, which includes: a supporter; a corresponding supporter pivoted with the supporter and capable of being mutually engaged; a buckling structure, including a buckle unit and a corresponding buckle unit matched with each other, the buckle unit is disposed at one side of the supporter, and the corresponding buckle unit is disposed at one side of the corresponding supporter, one end of the buckle unit is detachably and rotatably buckled at an opposite end of the corresponding buckle unit, an opposite end of the buckle unit is detachably and rotatably buckled at one end of the corresponding buckle unit; and two connection bars parallel to each other and disposed at two opposite sides of the supporter and the corresponding supporter capable of being mutually engaged, wherein two ends of one of the connection bars are respectively pivoted with one end of the supporter and an opposite end of the corresponding supporter, two ends of the other connection bar are respectively pivoted with an opposite end of the supporter and one end of the corresponding supporter, so when the corresponding supporter and one of the connection bars are rotated and unfolded towards an end direction of the supporter, one end of the buckle unit is able to be rotatably buckled at the opposite end of the corresponding buckle unit, or when the corresponding supporter and the other connection bar are rotated and unfolded towards an opposite end direction of the supporter, the opposite end of the buckle unit is able to be rotatably buckled at one end of the corresponding buckle unit, thereby forming the dual-directional opening operation.

Accordingly, the present invention provides a connecting device capable of opening and engaging in dual directions designed to be installed with one supporter, one corresponding supporter and two connection bars, so a dual-directional opening effect is provided, when being applied in an image capturing device such as a digital camera, the screen is enabled to be rotated and adjusted towards a direction corresponding to the high or low image capturing location thereby providing convenience to users; when being engaged, the volume is able to be reduced due to the thinner design, so the whole thickness is less likely to be affected by the installation of the supporter and is enabled to be similar or equal to the thickness of the hinge thereby being facilitated to be hidden and installed on the screen or a side wall of the machine housing so the appearance is prettified and the convenience in use is provided.

DETAILED DESCRIPTION OF THE PREFERRED EMBODIMENT

Referring from FIG. 1 to FIG. 7, the connecting device capable of opening and engaging in dual directions provided by the present invention includes a supporter (10), a corresponding supporter (20) and two connection bars (30, 40). The corresponding supporter (20) is able to be engaged with the supporter (10), and the corresponding supporter (20) and the supporter (10) are arranged with a mutually parallel means. Each of the connection bars (30, 40) is respectively parallel to the supporter (10) and the corresponding supporter (20), and two ends of each of the connection bars (30, 40) are respectively pivoted with the supporter (10) and the corresponding supporter (20), thereby enabling the corresponding supporter (20) to be rotated and unfolded towards an end direction (D1) of the supporter (10) or to be rotated and unfolded towards an opposite end direction (D2) of the supporter (10) so as to form the dual-directional opening operation.

Figure 2:
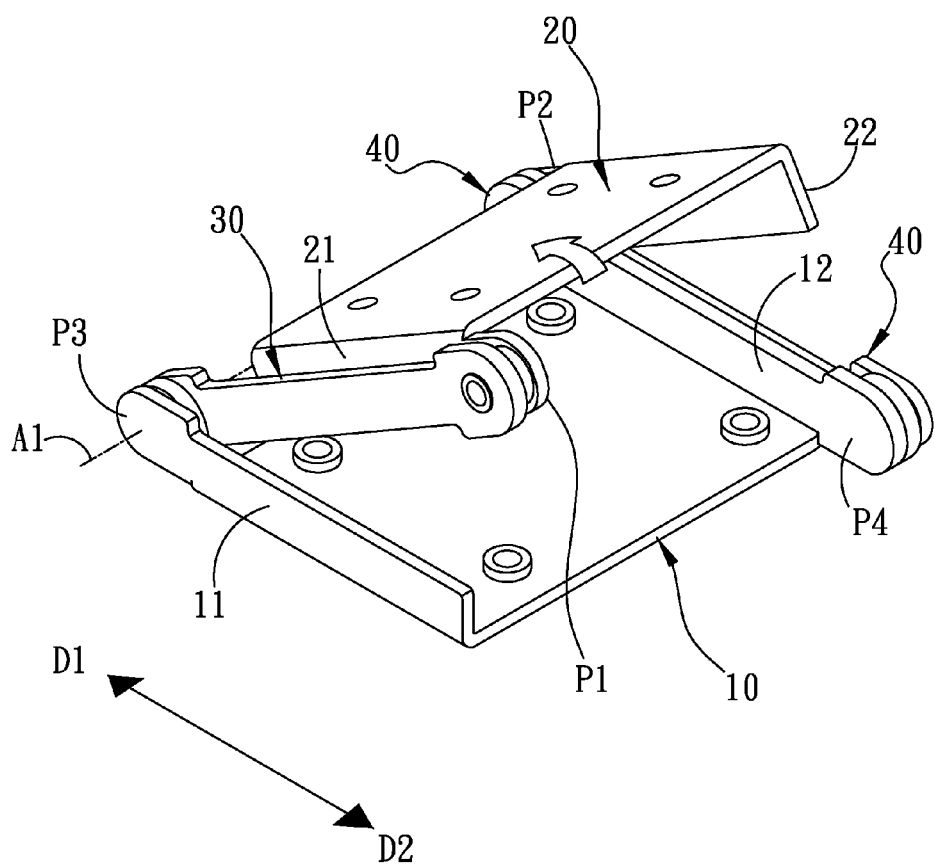
FIG. 2 is a schematic view illustrating the corresponding supporter shown in FIG. 1 being rotated and unfolded towards one direction.
Figure 3:
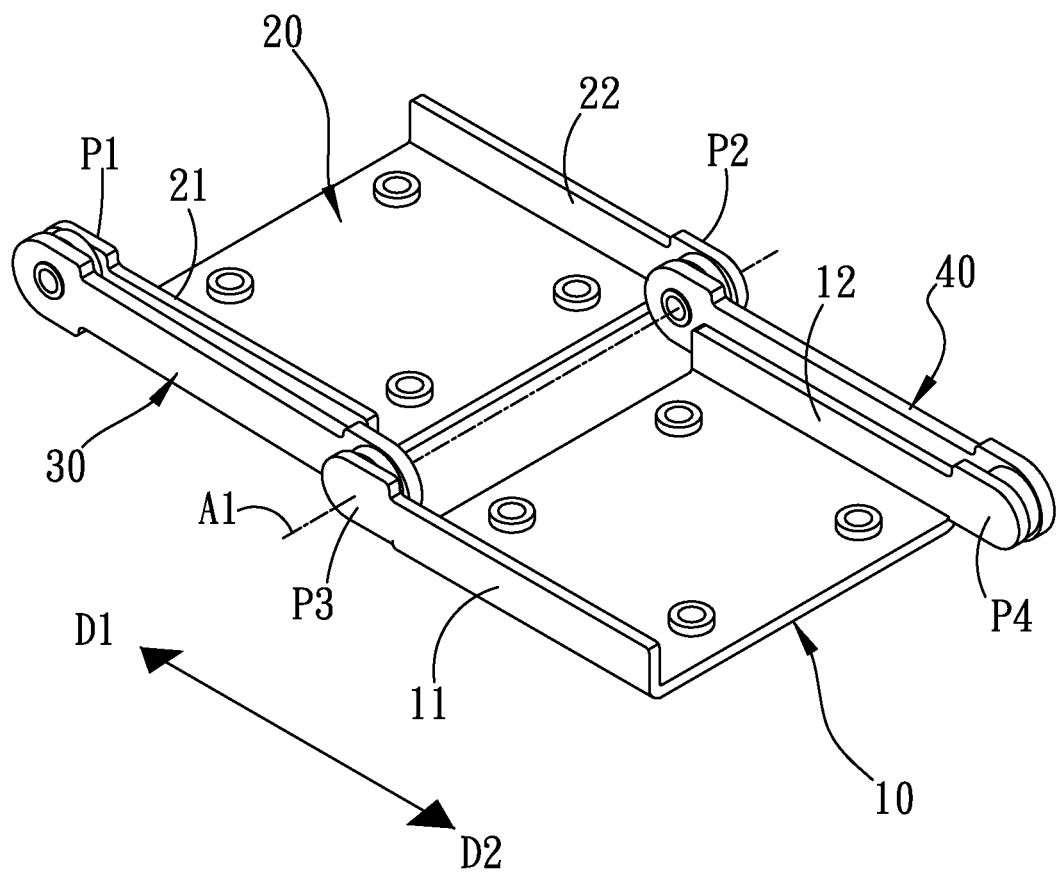
FIG. 3 is a schematic view illustrating the corresponding supporter shown in FIG. 2 being rotated to 180 degrees relative to the supporter.
Figure 4:
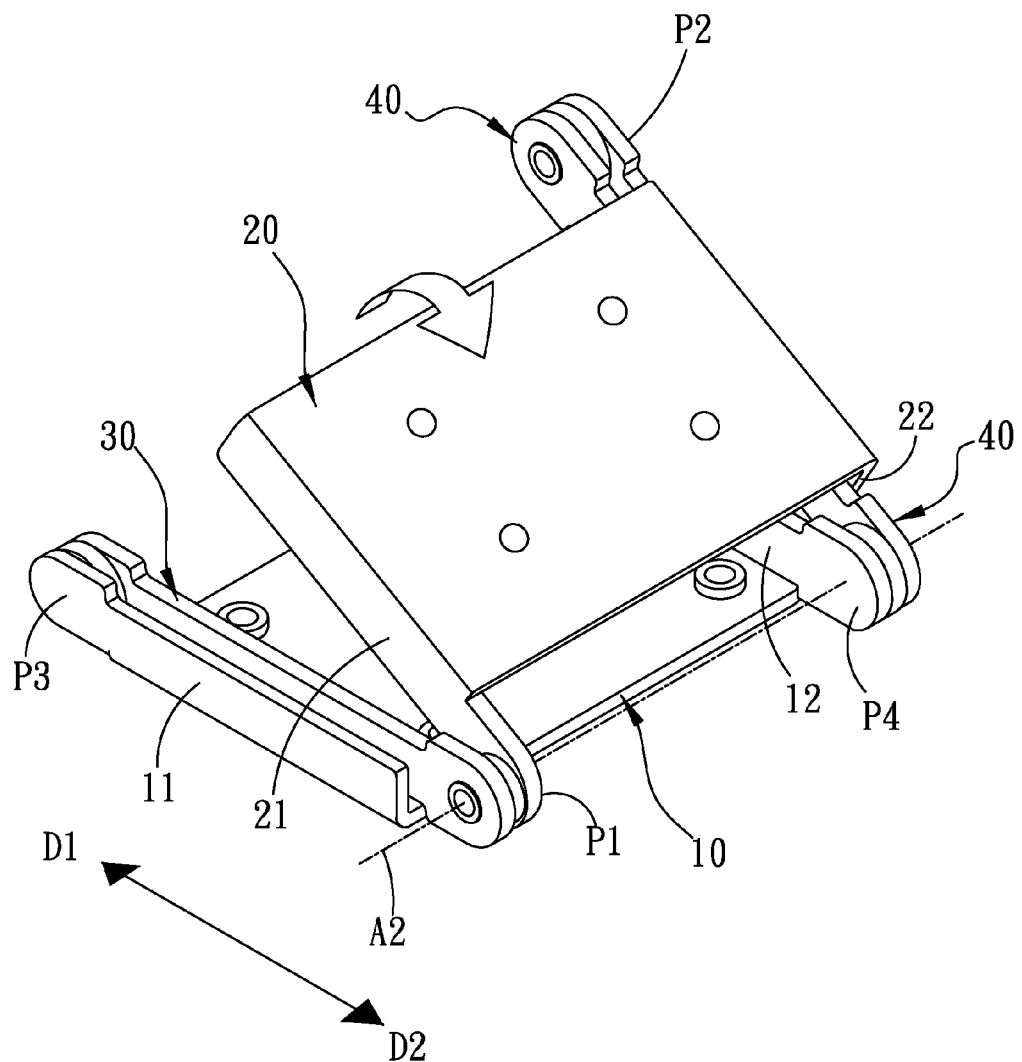
FIG. 4 is a schematic view illustrating the corresponding supporter shown in FIG. 1 being rotated and unfolded towards another direction.

As shown in FIG. 2 and FIG. 3, two opposite sides of the supporter (10) are respectively provided with a first bending sheet (11) and a second bending sheet (12), two opposite sides of the corresponding supporter (20) are respectively provided with a third bending sheet (21) and a fourth bending sheet (22); when being in an engaged status, the third bending sheet (21) or the fourth bending sheet (22) is abutted against the supporter (10), and the first bending sheet (11) or the second bending sheet (12) is abutted against the corresponding supporter (20), thereby generating a gap (G) due to the mutual support provided by the supporter (10) and the corresponding supporter (20) when the corresponding supporter (20) being engaged with the supporter (10); according to this embodiment, the third and the fourth bending sheets (21, 22) can also be respectively abutted against the first and the second bending sheets (11, 12) and the gap (G) is also enabled to be generated.

Figure 5:
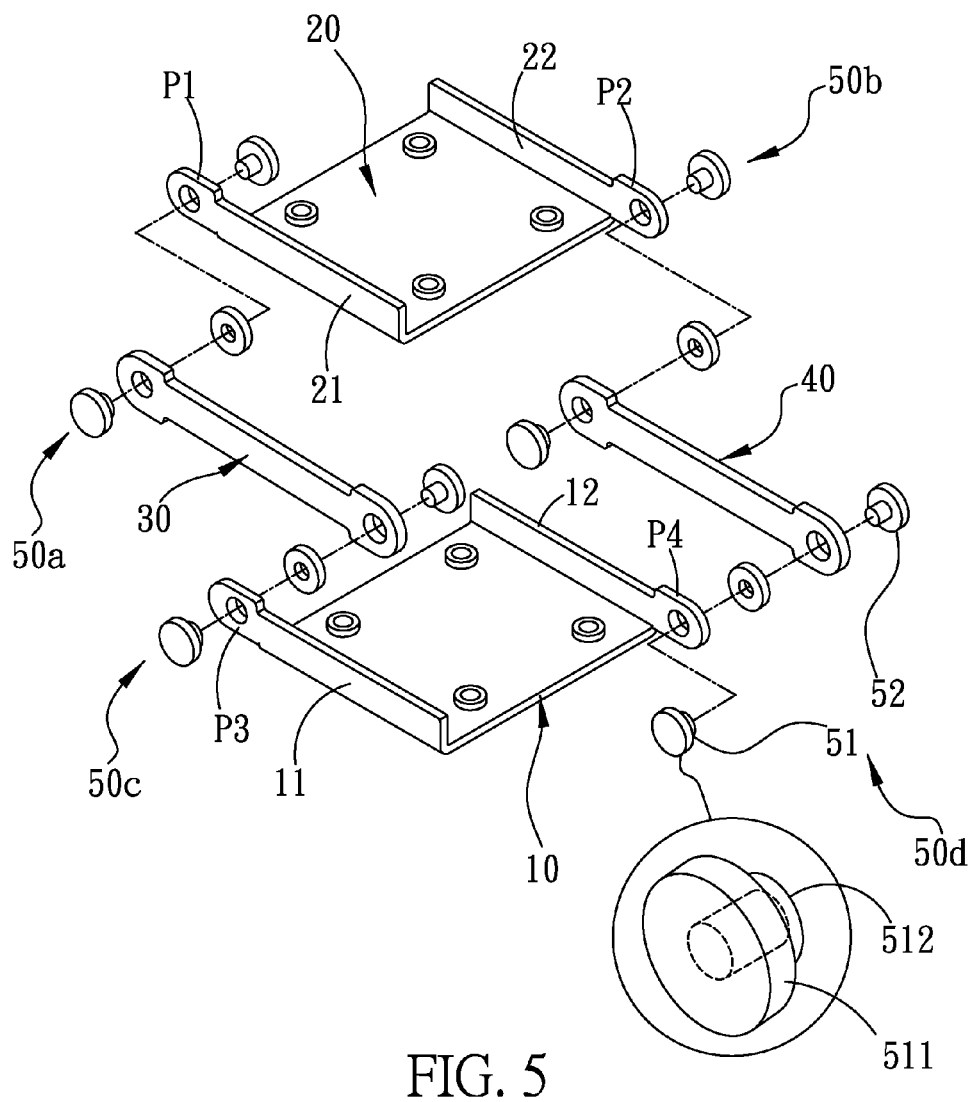
FIG. 5 is a perspective exploded view illustrating the connecting device shown in FIG. 3 being respectively installed with a pivotal shaft at the locations where the connection bars and the first and the second and the third and the fourth bending sheets being pivoted.

In actual practice, the dimension of the supporter (10) and the dimension of the corresponding supporter (20) can be the same or different, for allowing the supporter (10) and the corresponding supporter (20) having different dimension to be mutually engaged or allowing the supporter (10) and the corresponding supporter (20) having the same dimension to be staggeringly engaged, as shown in FIG. 5 (also referring to FIG. 6 and FIG. 7), a pivotal shaft (50a, 50b, 50c, 50d) is respectively installed at the location where each of the connection bars (30, 40), the first bending sheet (11), the second bending sheet (12), the third bending sheet (21) and the fourth bending sheet (22) are pivoted, the four pivotal shafts (50a, 50b, 50c, 50d) are arranged with a means of every two being coaxial with each other, and the two coaxial pivotal shafts (50b, 50c) are parallel to the other two coaxial pivotal shafts (50a, 50d), so the supporter (10) and the corresponding supporter (20) having the same or different dimension are enabled to be horizontally displaced relative to each other in the axial direction, thereby being staggeringly engaged or correspondingly engaged.

Referring from FIG. 1 to FIG. 4, according to the connecting device provided by the present invention, two opposite ends of the supporter (10) are respectively installed with a third pivotal part (P3) and a fourth pivotal part (P4); the corresponding supporter (20) is engaged with the supporter (10), two opposite ends of the corresponding supporter (20) are respectively installed with a first pivotal part (P1) and a second pivotal part (P2); the two connection bars (30, 40) are arranged in parallel, wherein two ends of one of the connection bars (30) are respectively pivoted with the first pivotal part (P1) and the third pivotal part (P3), and two ends of the other connection bar (40) are respectively pivoted with the second pivotal part (P2) and the fourth pivotal part (P4), so the corresponding supporter (20) and the connection bar (30) are allowed to respectively utilize the second and the third pivotal parts (P2, P3) as a rotation axis for being rotated and unfolded towards the end direction (D1) of the supporter (10), or the corresponding supporter (20) and the other connection bar (40) are allowed to respectively utilize the first and the fourth pivotal parts (P1, P4) as a rotation axis for being rotated and unfolded towards the opposite end direction (D2) of the supporter (10) thereby forming the dual-directional opening operation, the whole thickness and area defined while the supporter (10) and the corresponding supporter (20) being engaged is able to be reduced thereby achieving the advantages of being thinner and occupying less space; and the two connection bars (30, 40) can be respectively served to work with an unfolding operation towards a certain direction so the corresponding supporter (20) is prevented from being released from the supporter (10) and the stable rotating and unfolding operation can be ensured, thus when the corresponding supporter (20) is rotated and unfolded towards the end direction (D1), the corresponding supporter (20) has to be engaged with the supporter (10) before being rotated and unfolded towards the opposite end direction (D2), and vice versa.

Figure 1:
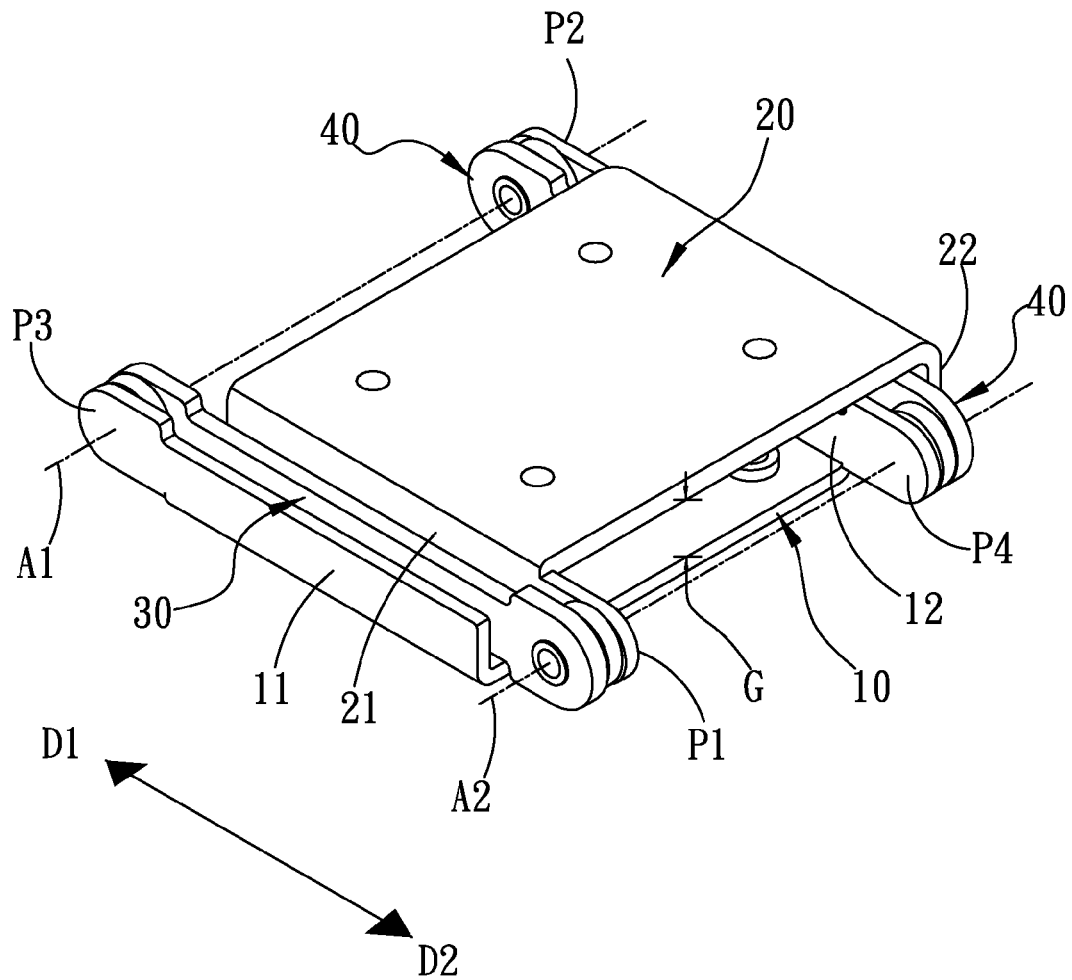
FIG. 1 is a perspective view illustrating the connecting device capable of opening and engaging in dual directions being in an engaged status according to the first embodiment of the present invention.

In actual practice, the first and the second pivotal parts (P1, P2) at the two opposite ends (defined as the top and the bottom end) of the corresponding supporter (20) and the third and the fourth pivotal parts (P3, P4) at the two opposite ends (defined as the top and the bottom end) of the supporter (10) can all be arranged at corners, referring to FIG. 1 and FIG. 3, the first pivotal part (P1) and the second pivotal part (P2) are respectively extended from two opposite corners of the corresponding supporter (20), the third pivotal part (P3) and the fourth pivotal part (P4) are respectively extended from two opposite corners of the supporter (10); the two connection bars (30, 40) parallel to each other are respectively in parallel to the corresponding supporter (20) and the supporter (10), and two ends of the connection bar (30) are respectively aligned with the first pivotal part (P1) and the second pivotal part (P2), and two ends of the other connection bar (40) are respectively aligned with the third pivotal part (P3) and the fourth pivotal part (P4), thereby enabling the second and the third pivotal parts (P2, P3) to be at an axial line (A1) and the first and the fourth pivotal parts (P1, P4) to be at another axial line (A2).

Because two opposite sides of the supporter (10) are respectively provided with the first bending sheet (11) and the second bending sheet (12), in actual practice, the third pivotal part (P3) is able to be extended from the first bending sheet (11) towards the end direction (D1) of the supporter (10), the fourth pivotal part (P4) is able to be extended from the second bending sheet (12) towards the opposite end direction (D2) of the supporter (10), and the third and the fourth pivotal parts (P3, P4) are respectively arranged at two opposite corners of the supporter (10); two opposite sides of the corresponding supporter (20) are respectively provided with the third bending sheet (21) and the fourth bending sheet (22), the first pivotal part (P1) is able to be extended from the third bending sheet (21) towards the end direction (D1) of the corresponding supporter (20), the second pivotal part (P2) is able to be extended from the fourth bending sheet (22) towards the opposite end direction (D2) of the corresponding supporter (20), and the first and the second pivotal parts (P1, P2) are respectively arranged at two opposite corners of the corresponding supporter (20), thereby generating the gap (G) due to the mutual support provided by the supporter (10) and the corresponding supporter (20) when the corresponding supporter (20) being engaged with the supporter (10), so wires are allow to pass or be hidden therein, and the whole appearance can be prettified and more quality is provided.

Figure 6:
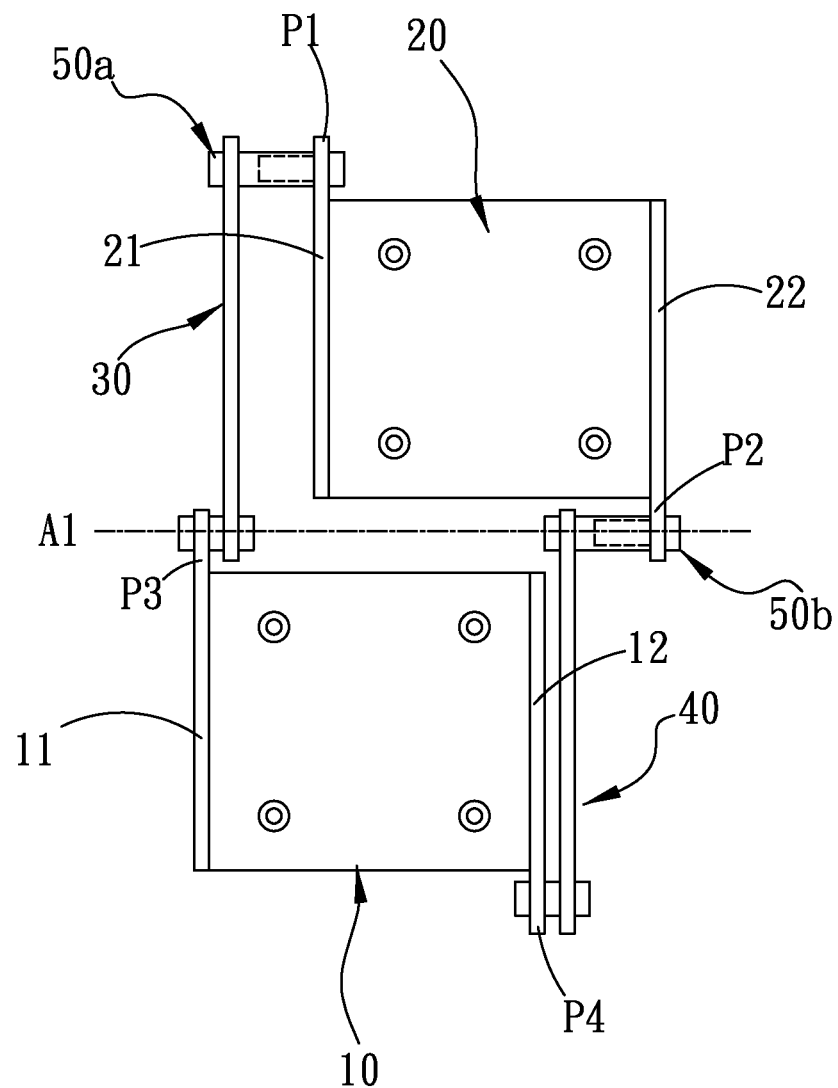
FIG. 6 is a schematic view illustrating the corresponding supporter shown in FIG. 5 being horizontally displaced relative to the supporter after the pivotal shafts being additionally installed according to the first embodiment of the present invention.
Figure 7:
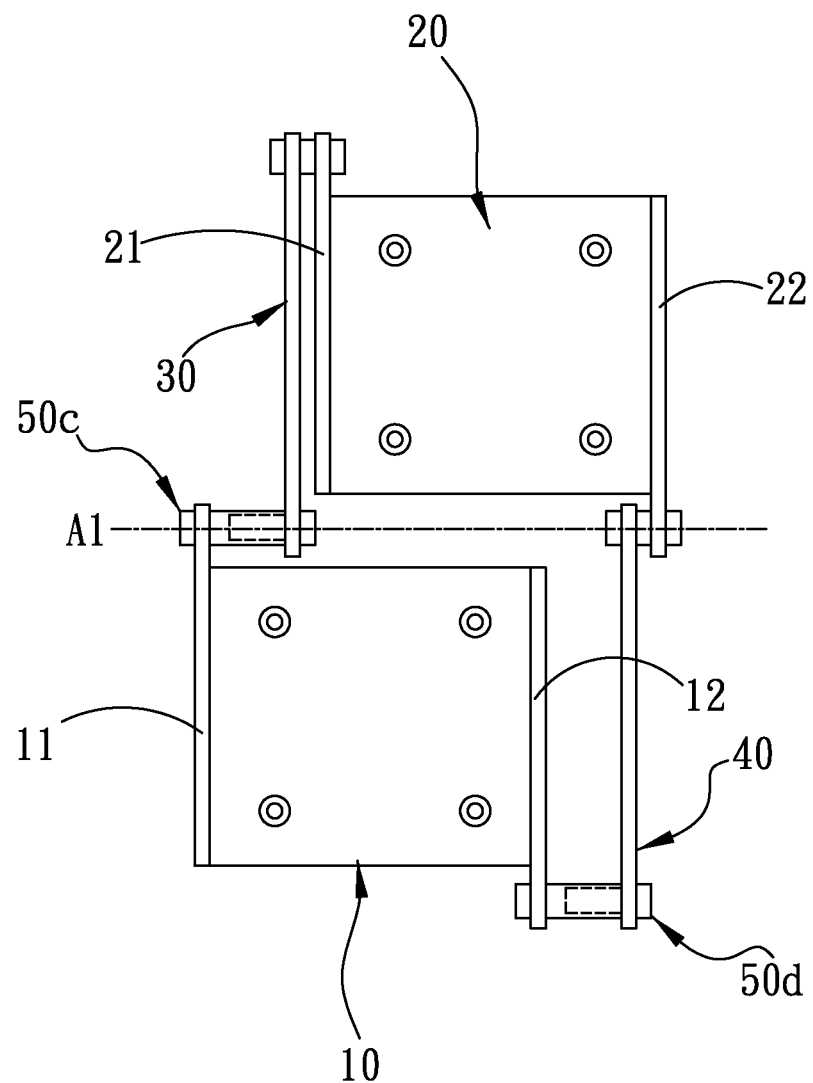
FIG. 7 is a schematic view illustrating the supporter shown in FIG. 5 being horizontally displaced relative to the corresponding supporter after the pivotal shafts being additionally installed according to the first embodiment of the present invention.

According to the present invention, the first, the second, the third and the fourth pivotal parts (P1, P2, P3, P4) can be optionally installed with a pivotal shaft according to the actual needs, as shown in FIG. 6, a pivotal shaft (50*a*, 50*b*) is respectively installed between the connection bar (30) and the first pivotal part (P1) and between the other connection bar (40) and the second pivotal part (P2), the pivotal shafts (50*a*, 50*b*) are parallel to each other, thereby enabling the corresponding supporter (20) to be horizontally displaced in the axial direction relative to the supporter (10) so as to be staggeringly engaged or correspondingly engaged; or as shown in FIG. 7, a pivotal shaft (50*c*, 50*d*) is respectively installed between the connection bar (30) and the third pivotal part (P3) and between the other connection bar (40) and the fourth pivotal part (P4), the pivotal shafts (50*c*, 50*d*) are parallel to each other, thereby enabling the supporter (10) to be horizontally displaced in the axial direction relative to the corresponding supporter (20) so as to be staggeringly engaged or correspondingly engaged.

According to the embodiment provided by the present invention, each of the pivotal shafts (50*a*, 50*b*, 50*c*, 50*d*) includes an axial core member (51) and a fasten member (52) pivotally connected to each other, two ends of the axial core member (51) are respectively formed as a stop part (511) and a connection part (512), the fasten member (52) is correspondingly pivoted with the connection part (512), thereby enabling each of the pivotal shafts (50*a*, 50*b*, 50*c*, 50*d*) to be easily detached, assembled and replaced, so the present invention is provided an adjustable effect and the operation convenience is also provided.

In addition, when the present invention is applied in a machine housing of an electronic product (e.g. a digital camera, a notebook computer, a mobile phone) or a screen (e.g. a touch screen), less space is occupied, and the gap generated while the machine housing and the screen (or the touch screen) being engaged can be reduced, so the screen is enabled to be mounted on the surface of the machine housing, for example, for allowing the present invention to be disposed in an accommodation slot (not shown in figures) formed on the surface of the machine housing, the supporter (10) is connected to the machine housing, the corresponding supporter (20) is connected to the backside of the screen (or the touch screen), when a user lifts and unfolds the screen (or the touch screen), the screen of the electronic product is provided with a dual-directional opening effect, the supporter can also be connected to the screen and the corresponding supporter is connected to the machine housing, the same dual-directional opening effect is also provided.

According to the connecting device capable of opening and engaging in dual directions disclosed in the first embodiment of the present invention, each of the connection bars (30, 40) is respectively pivoted with the four pivotal parts (P1~P4) of the supporter (10) and the corresponding supporter (20), when the corresponding supporter (20) is rotated and unfolded in the initial status, only one of the connection bars (30, 40) is enabled to be linked for operation, i.e. one of the connection bars (30) is rotated with the corresponding supporter (20) towards the end direction (D1), the other connection bar (40) is abutted against the supporter (10), when the other connection bar (40) is rotated with the corresponding supporter (20) towards the opposite end direction (D2), the connection bar (30) is abutted against the supporter (10), thereby stabilizing the initial rotating and unfolding operation of the corresponding supporter (20).

Figure 8:
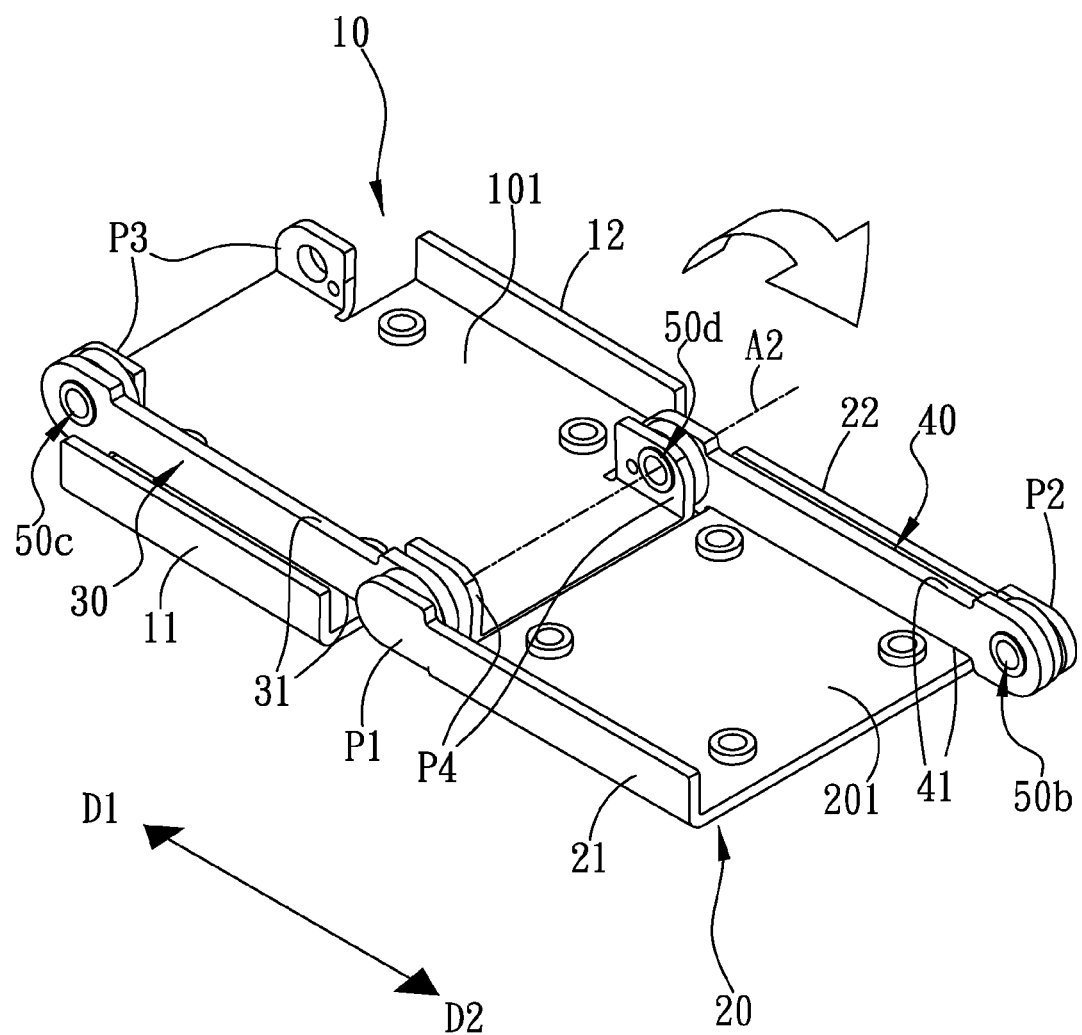
FIG. 8 is a schematic view illustrating the corresponding supporter being rotated and unfolded towards an opposite end direction according to the first embodiment of the present invention, wherein the corresponding supporter shown in FIG. 3 working with another supporter.

For expanding the configuration variety of the supporter (10) and the corresponding supporter (20) and allowing the above two to be mutually engaged, the four pivotal parts (P1~P4) of the present invention can be optionally arranged at two opposite ends, two opposite corners or two ends at the same side of the supporter (10) and the corresponding supporter (20), as shown in FIG. 8, the first and the second parts (P1, P2) are respectively arranged at two opposite corners of the corresponding supporter (20), the third and the fourth pivotal parts (P3, P4) are respectively arranged at two opposite ends of the supporter (10), i.e. the third and the fourth pivotal parts (P3, P4) being respectively and horizontally extended from two opposite edges of a supporter main body (101) and being vertically formed as pivotal lugs arranged as a pair and disposed with an interval, thereby allowing two ends of the connection bar (30) to be respectively pivoted with the pivotal lug at the left side of the third pivotal part (P3) and the first pivotal part (P1), and the other connection bar (40) is pivoted with the pivotal lug at the right side of the fourth pivotal part (P4) and the second pivotal part (P2).

Figure 9:
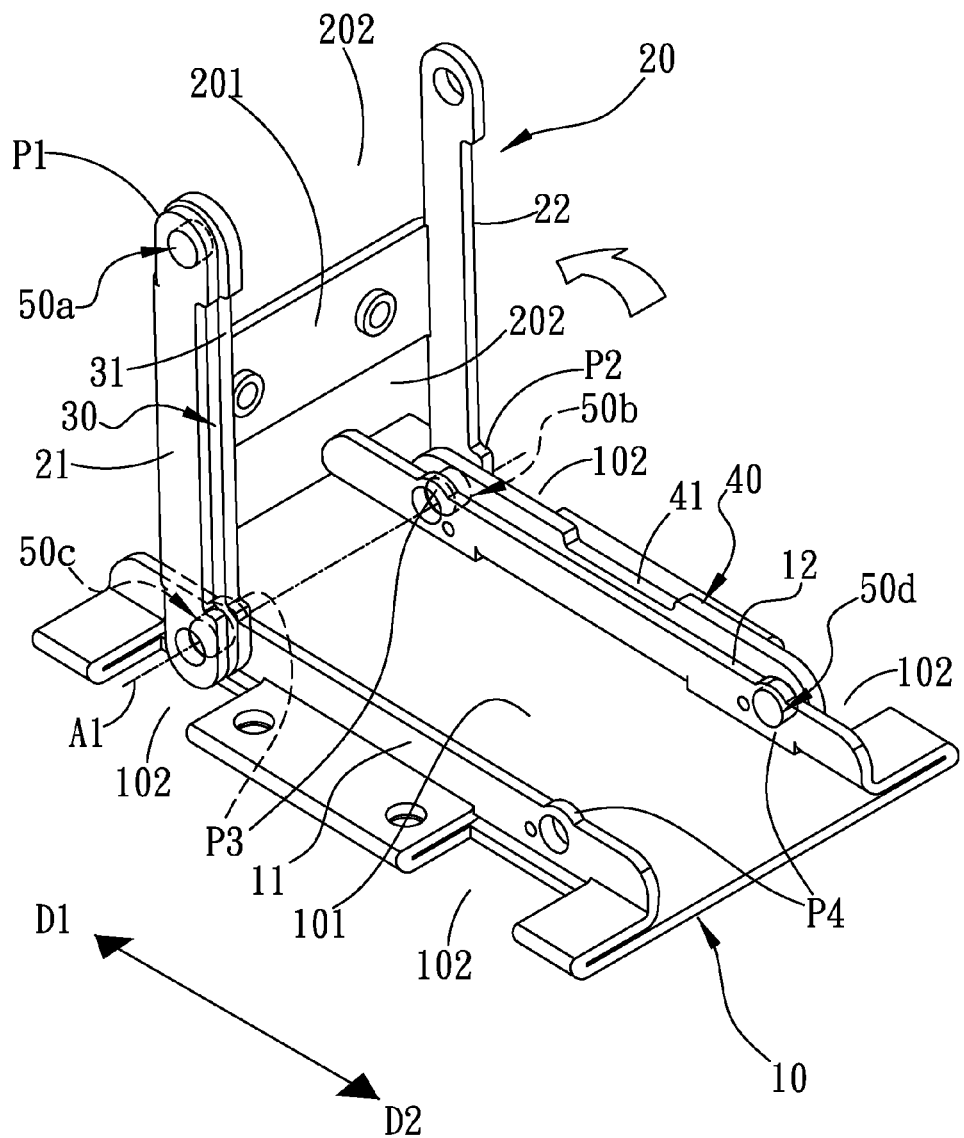
FIG. 9 is a schematic view illustrating the corresponding supporter being rotated and unfolded towards an end direction according to the first embodiment of the present invention, wherein the third and the fourth pivotal parts being arranged with an interval on the supporter main body.

In addition, besides the installed locations of the four pivotal parts (P1~P4) disclosed from FIG. 1 to FIG. 8, the four pivotal parts (P1~P4) can also be arranged on a main body (201) of the corresponding supporter (20) and/or the main body (101) of the supporter (10) and disposed at intervals (i.e. being directly or indirectly arranged on the surface of the main body of the corresponding supporter (20) and/or the supporter (10) and disposed at intervals), the characteristic difference disclosed in FIG. 9 is that: the main body (101) is formed between two ends of the supporter (10), the main body (101) is installed with the third pivotal part (P3) and the fourth pivotal part (P4) spaced with an interval, the third and the fourth pivotal parts (P3, P4) are respectively arranged with an interval at the two pairs of pivotal lugs of the main body (101) (i.e. being arranged on the surface of the supporter (10)), each pair of the pivotal lugs includes two pivotal lugs formed as a pair and arranged with an interval, and the first and the second pivotal parts (P1, P2) are respectively arranged at two opposite ends of the corresponding supporter (20) (i.e. being arranged with an interval on the main body of the corresponding supporter), and pivotal lugs formed as a pair and arranged with an interval are also provided, thereby allowing two ends of the connection bar (30) to be respectively pivoted with the pivotal lug at the left side of the first pivotal part (P1) and the left side of the third pivotal part (P3), and two ends of the other connection bar (40) to be respectively pivoted with the pivotal lug at the right side of the second pivotal part (P2) and the right side of the fourth pivotal part (P4), so the two matched connection bars (30, 40) are able to be disposed in parallel between the supporter (10) and the corresponding supporter (20) when the supporter (10) and the corresponding supporter (20) are mutually engaged, thereby also forming the dual-directional opening operation.

Figure 10:
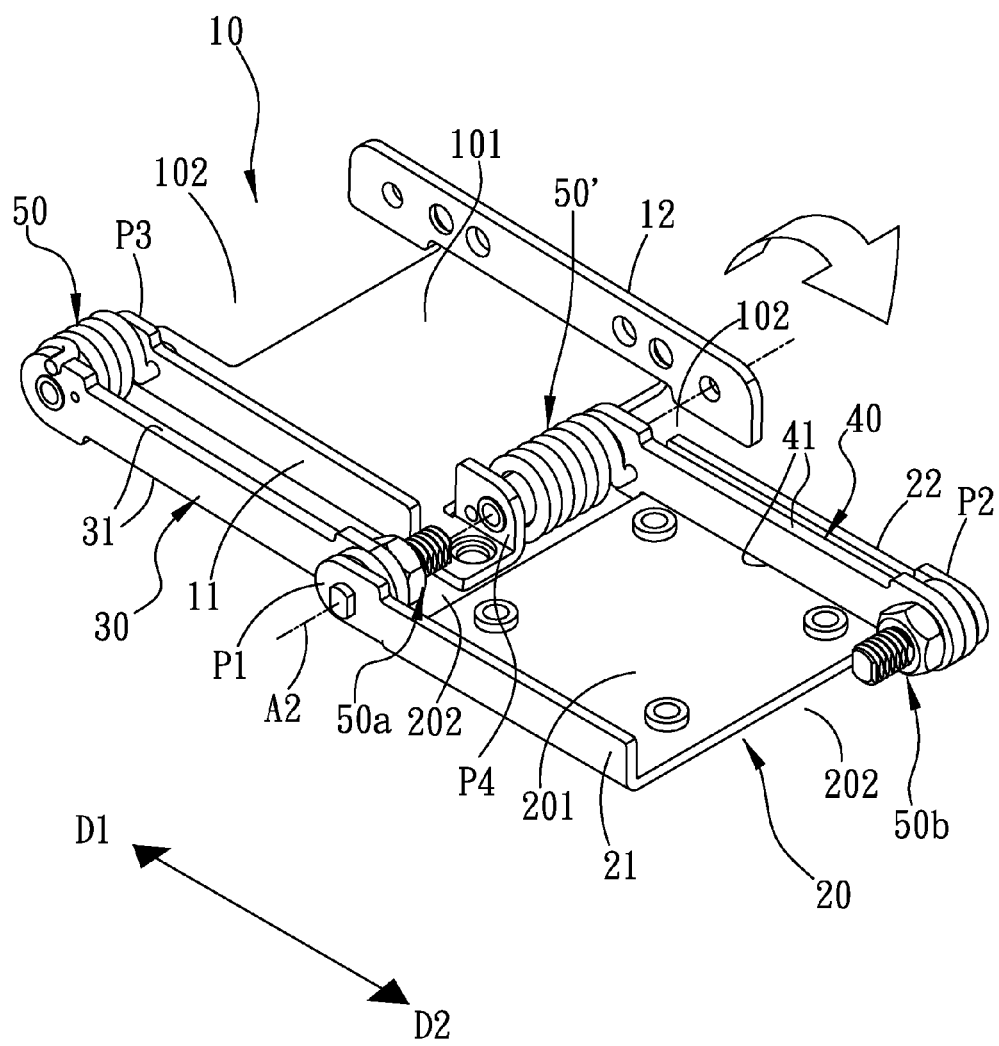
FIG. 10 is a schematic view illustrating the corresponding supporter being rotated and unfolded towards an opposite end direction according to the second embodiment of the present invention.
Figure 12:
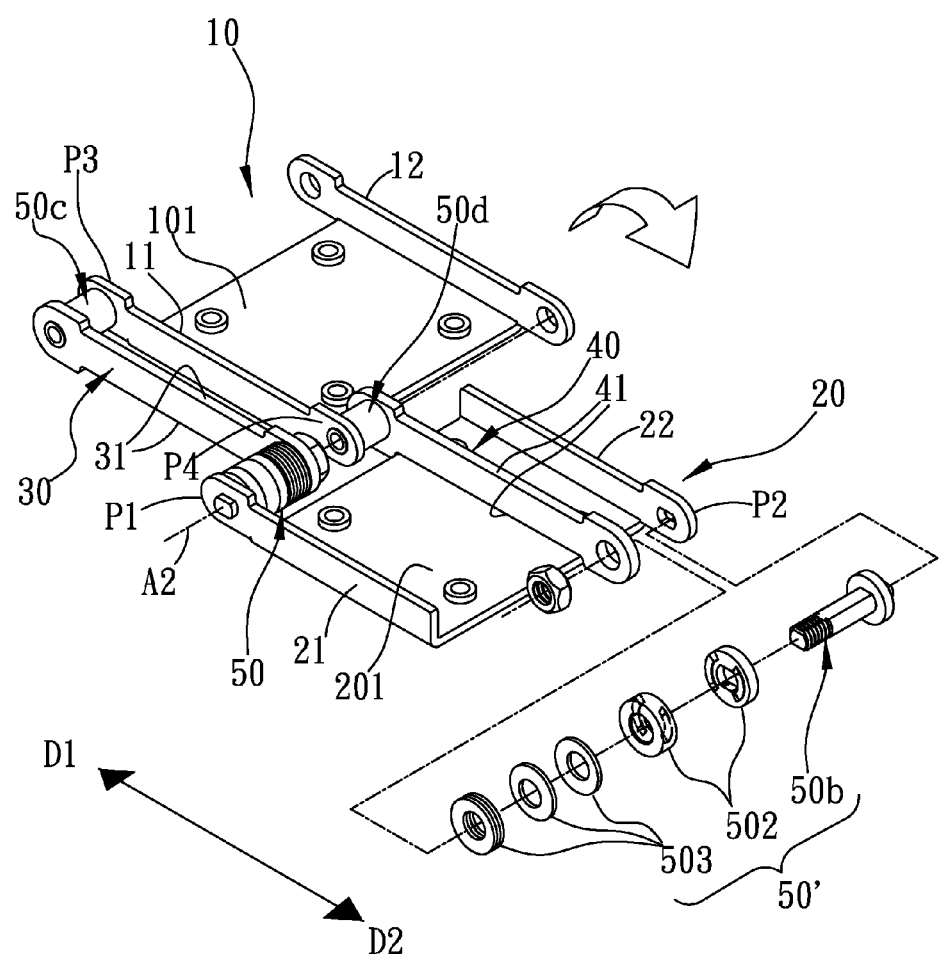
FIG. 12 is a perspective view illustrating each of the hinges including a pivotal shaft, at least a cam and at least an elastic member according to the second embodiment of the present invention.
Figure 13:
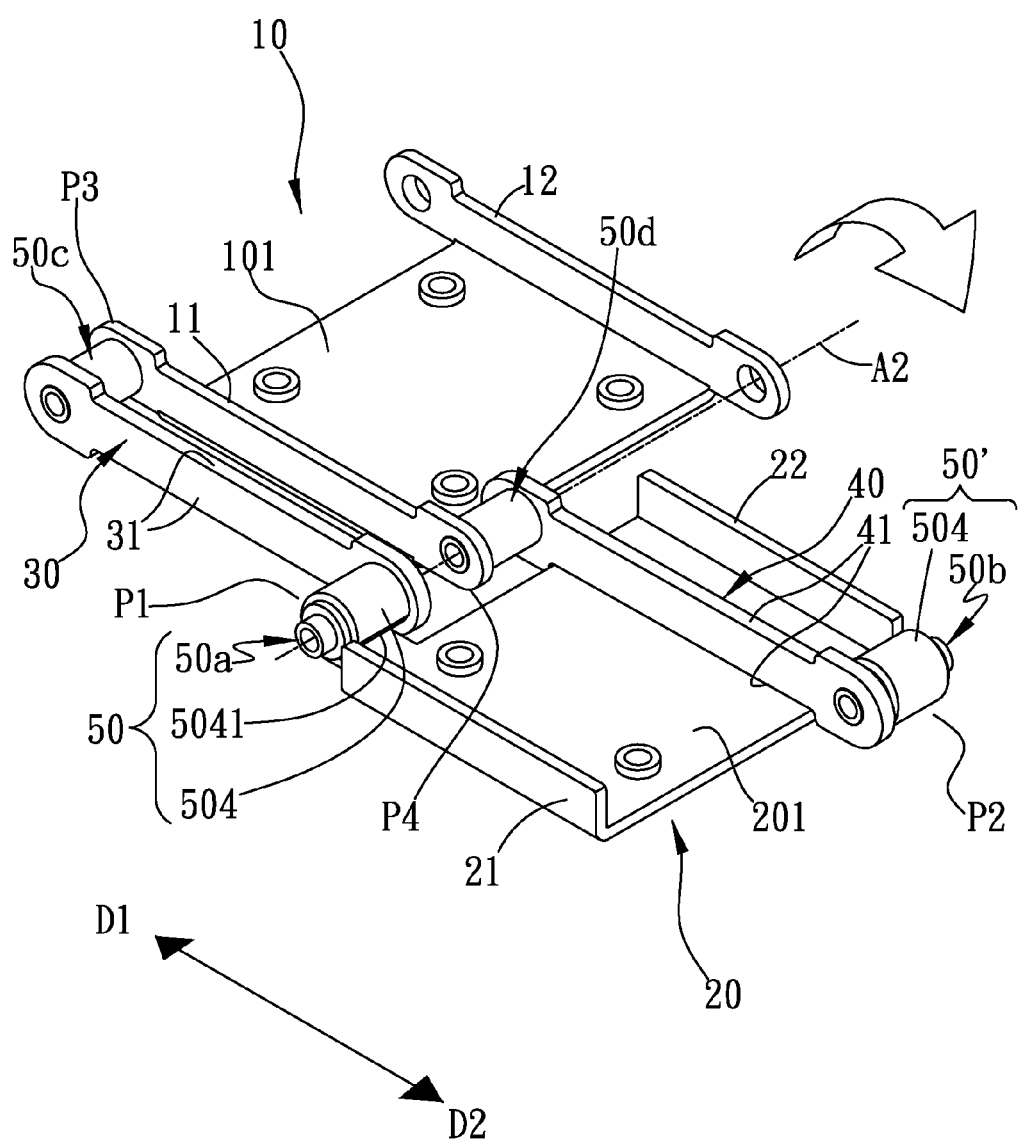
FIG. 13 is a perspective view illustrating each of the hinges including a pivotal shaft and a covering structure according to the second embodiment of the present invention.

Moreover, the four pivotal parts (P1~P4) can also be arranged as what is shown in FIG. 10, the first and the second pivotal parts (P1, P2) are respectively arranged at opposite corners of the corresponding supporter (20), the third pivotal part (P3) is arranged at a corner of the supporter (10), the fourth pivotal part (P4) is arranged at an opposite edge of the supporter (10) and staggered with the third pivotal part (P3), in other words, the fourth pivotal part (P4) is formed as being horizontally extended from the opposite edge of the supporter main body (101) then being vertically arranged, and the first and the third pivotal parts (P1, P3) are formed as being respectively extended from one end and one side of the corresponding supporter (20) and one end and one side of the supporter (10) towards the end direction (D1), the second pivotal part (P2) is formed as being extended from the opposite end and the opposite side of the corresponding supporter (20) towards the opposite end direction (D2); or as shown in FIG. 12 and FIG. 13, the first and the second pivotal parts (P1, P2) are respectively arranged at two opposite ends of the corresponding supporter (20) and both formed with the pivotal lugs formed as a pair and arranged with an interval, thereby allowing the two opposite ends at one side of the corresponding supporter (20) (i.e. the pivotal lugs at the left side of the first pivotal part (P1) and the left side of the second pivotal part (P2)) are respectively pivoted with each of the connection bars (30, 40), the difference between FIG. 12 and FIG. 13 is that: the third and the fourth pivotal parts (P3, P4) shown in FIG. 12 are respectively arranged at opposite corners of the supporter (10), the third and the fourth pivotal parts (P3, P4) shown in FIG. 13 are respectively arranged at two opposite edges and formed in a staggering status.

As shown in FIG. 9, two opposite sides of the supporter (10) are respectively provided with the first bending sheet (11) and the second bending sheet (12), two opposite sides of the corresponding supporter (20) are respectively provided with the third bending sheet (21) and the fourth bending sheet (22), thereby generating a gap due to the mutual support provided by the supporter (10) and the corresponding supporter (20) when the corresponding supporter (20) being engaged with the supporter (10), and each of the connection bars (30, 40) is respectively parallel to the first and the third bending sheets (11, 21) and the second and the fourth bending sheets (12, 22); the first and the second bending sheets (11, 12) are bent for multiple times so partial sheet members (111, 121) thereof are vertical to the main body (101) of the supporter (10), thereby facilitating the corresponding supporter (20) having different dimension to be pivoted with the supporter (10), and other partial sheet members (112, 122) are enabled to be stacked on the supporter main body (101) for being used for fastening (e.g. allowing screwed to be locked on the machine housing) or used for flexibly adjusting (e.g. flexibly adjusting the stacking tightness for altering the gap formed between the supporter and the corresponding supporter), so the arrangement disclosed above is different from the first and the second bending sheets (11, 12) shown from FIG. 1 to FIG. 8 which is bent for single time and vertical to two sides of the supporter (10), what shall be addressed is that the third and the fourth bending sheets (21, 22) of the corresponding supporter (20) can adopt the same technical means. As shown in FIG. 9, the locations where each of the connection bars (30, 40) being respectively pivoted with the first bending sheet (11), the second bending sheet (12), the third bending sheet (13) and the fourth bending sheet (14) are all installed with the pivotal shaft (50a, 50b, 50c, 50d), the four pivotal shafts (50a, 50b, 50c, 50d) are arranged with a means of every two being coaxial with each other, and the two coaxial pivotal shafts (50b, 50c) are parallel to the other two coaxial pivotal shafts (50a, 50d), thereby facilitating the assembly.

The main body (101, 201) made of a sheet material is respectively formed between two opposite ends of the supporter (10) and two opposite ends of the corresponding supporter (20), a concave part (31, 41) is respectively formed between two ends of each of the connection bars (30, 40) (e.g. being formed as an annular groove or a groove at two sides of the mid bar body), thereby forming a status of each bar end being wider and the mid bar body being narrower, the concave part (31, 41) of each of the connection bars (30, 40) is corresponding to each of the main bodies (101, 201) (referring to FIG. 1 and FIG. 9); at least two notches (102, 202) are respectively formed on the supporter (10) and the corresponding supporter (20), each of the notches (102, 202) are respectively served to accommodate the bar ends of each of the connection bars (30, 40), so when the two supporters are engaged, each of the main bodies (101, 201) is enabled to be mounted and positioned in one of the concave parts (31 or 41) or respectively mounted and positioned in each of the concave parts (31, 41), each of the bar ends is respectively received in each of the notches (102, 202), thereby enabling each of the connection bars (30, 40) to be respectively adjacent and abutted against the supporter (10) and the corresponding supporter (20) and allowing a parallel status to be formed when the supporter (10) and the corresponding supporter (20) are mutually engaged, so an effect of being thinner is achieved.

Referring from FIG. 10 to FIG. 13, according to the second embodiment provided by the present invention, the connecting device capable of opening and engaging in dual directions includes a supporter (10), a corresponding supporter (20), two hinges (50, 50') and two connection bars (30, 40). The supporter (10) is installed with a third pivotal part (P3) and a fourth pivotal part (P4) arranged with an interval. The corresponding supporter (20) is pivoted with the supporter (10) and capable of being engaged with each other. The corresponding supporter (20) is installed with a first pivotal part (P1) and a second pivotal part (P2) arranged with an interval. The two hinges (50, 50') are parallel to each other and axially disposed at two opposite sides of the supporter (10) or the corresponding supporter (20). The two connection bars (30, 40) are parallel to each other and disposed at two opposite sides of the supporter (10) and the corresponding supporter (20) capable of being mutually engaged, wherein two ends of the connection bar (30) are respectively pivoted with the first pivotal part (P1) and the third pivotal part (P3), two ends of the other connection bar (40) are respectively pivoted with the second pivotal part (P2) and the fourth pivotal part (P4), so the corresponding supporter (20) and the connection bar (30) are allowed to respectively utilize the second and the third pivotal parts (P2, P3) as a rotation axis for being rotated and unfolded towards an end direction (D1) of the supporter (10) so as to generate a first torque variation, or the corresponding supporter (20) and the other connection bar (40) are allowed to respectively utilize the first and the fourth pivotal parts (P1, P4) as a rotation axis for being rotated and unfolded towards an opposite end direction (D2) of the supporter (10) so as to generate a second torque variation, thereby providing the torque variation to the dual-directional opening operation.

Two opposite sides of the supporter (10) are respectively provided with a first bending sheet (11) and a second bending sheet (12), two opposite sides of the corresponding supporter (20) are respectively provided with a third bending sheet (21) and a fourth bending sheet (22), thereby a gap being generated due to the mutual support provided by the supporter (10) and the corresponding supporter (20) when the corresponding supporter (20) being engaged with the supporter (10), each of the connection bars (30, 40) is respectively parallel to the first and the third bending sheets (11, 21) and to the second and the fourth bending sheets (12, 22); each of the hinges (50, 50') is disposed at the location where each of the connection bars (30, 40) being pivoted with the first bending sheet (11) and the second bending sheet (12), or at the location where each of the connection bars (30, 40) being pivoted with the third bending sheet (21) and the fourth bending sheet (22).

According to the second embodiment, the difference from the first embodiment disclosed from FIG. 1 to FIG. 9 is that: the two hinges (50, 50') are additionally installed, and each of the hinges (50, 50') is respectively disposed at the third pivotal part (P3) and the fourth pivotal part (P4) (as shown in FIG. 10), or each of the hinges (50, 50') is respectively disposed at the first pivotal part (P1) and the second pivotal part (P2) (as shown in FIG. 12), so each of the hinges (50, 50') is enabled to be respectively at two axial lines (A1, A2), so an effect of being thinner is still provided even the hinges (50, 50') being additionally installed, and when the corresponding supporter (20) is rotated and unfolded in dual directions relative to the supporter (10), one or plural effects of labor saving (automatic opening), automatic locking or relatively easier to be unfolded and harder to be folded can be provided.

Figure 11:
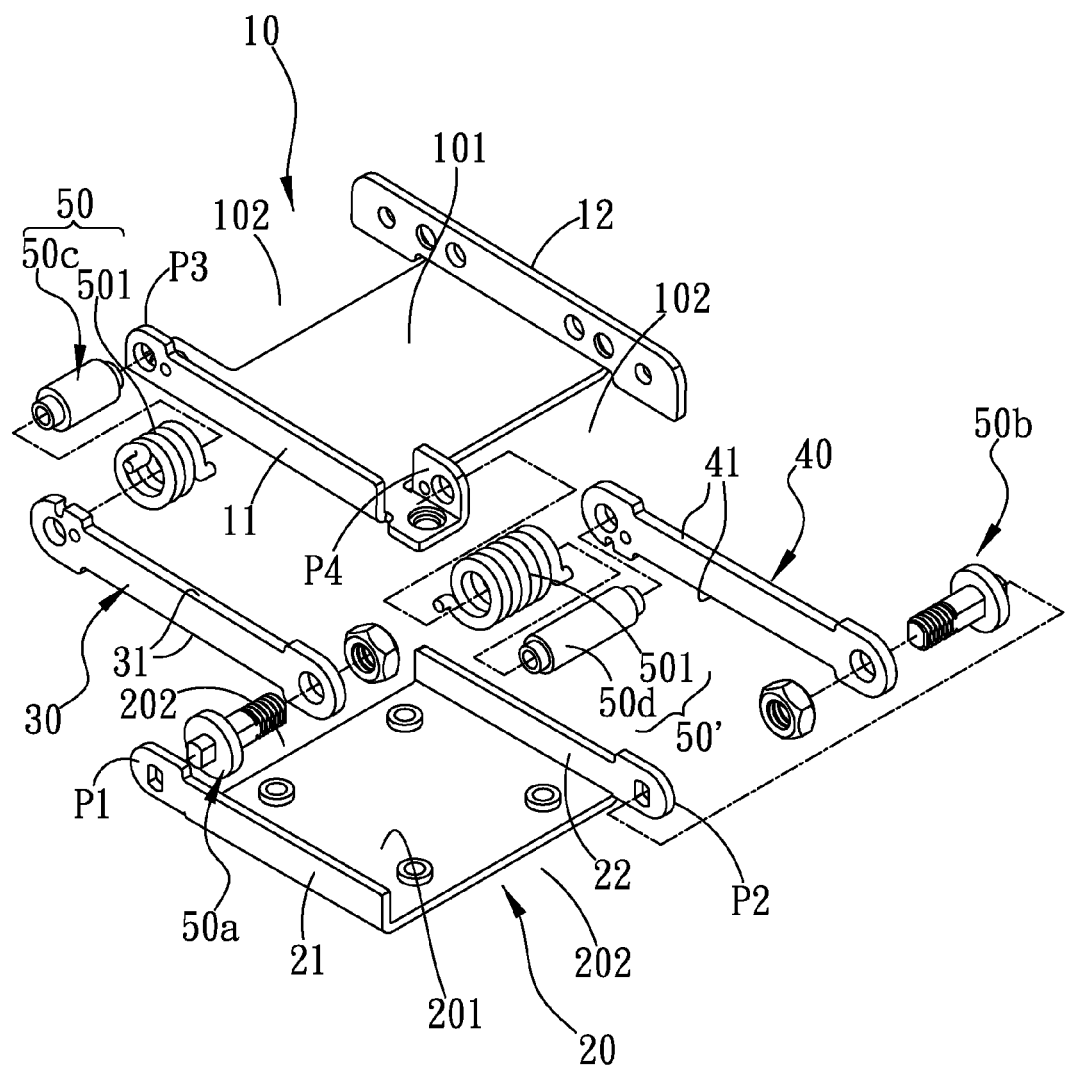
FIG. 11 is an exploded view of FIG. 9.

As shown in FIG. 10 and FIG. 11, each of the hinges (50, 50') includes a pivotal shaft (50c, 50d) and a torsion spring (501) sleeved on the pivotal shaft (50c, 50d), as shown in figures, each of the torsion springs (501) is provided with a preset elasticity and respectively sleeved on the pivotal shafts (50c, 50d) of the third and the fourth pivotal parts (P3, P4), one end of each of the torsion springs (501) is respectively positioned in positioning holes formed on the third and the fourth pivotal parts (P3, P4), the other end of each of the torsion springs (501) is respectively positioned in a positioning hole and a positioning groove formed on the bar end of each of the connection bars (30, 40), so an automatic opening effect is provided to the supporter (10) and the corresponding supporter (20) capable of being mutually engaged; on the other hands, an automatic engaging effect is provided after being rotated and unfolded.

As shown in FIG. 12, each of the hinges (50, 50') can alternatively include a pivotal shaft (50a, 50b) and least a cam (502) and at least an elastic member (503) sleeved on the pivotal shaft (50a, 50b), as shown in figures, the at least one cam (502) includes a mobile cam and a fixed cam capable of mutually pressing and pushing, the surfaces where the mobile cam being in contact with the fixed cam are respectively formed as a convex/concave surface, the at least one elastic member (503) includes plural disc-shaped elastic sheets stacked with each other, so when the corresponding supporter (20) is rotated, the mobile cam is rotated relative to the fixed cam for mutually pressing and pushing so as to form a stretched status, and the adjacent disc-shaped elastic sheets are pressed thereby generating an elastic force, so when the mobile cam is rotated relative to the fixed cam for being close to each other, an effect of automatic locking is provided.

As shown in FIG. 13, each of the hinges (50, 50') can alternatively include a pivotal shaft (50a, 50b) and a covering structure (504) sleeved on the pivotal shaft (50a, 50b), each of the covering structures (504) is formed as a covering cylinder having an axial opening (5041), and each of the covering structures (504) is combined on the supporter (10) or the corresponding supporter (20), as shown in figures, each of the covering structures (504) is formed with a covering sheet outwardly extended respectively from two opposite ends and staggered edges of the supporter (10), each of the covering sheets is respectively covered the periphery of each of the pivotal shafts (50a, 50b), and a gap is formed between each sheet edge and the supporter main body (101), thereby forming the covering cylinder having the axial opening (5041), so when the corresponding supporter (20) is unfolded or engaged relative to the supporter (10), an effect of providing relatively lighter rotating and unfolding torque and relatively heavier engaging torque is achieved.

Referring from FIG. 14 to FIG. 17, according to the connecting device capable of opening and engaging in dual directions disclosed in the third embodiment provided by the present invention, the technical characteristic same as the first embodiment is that: including a supporter (10); a corresponding supporter (20) pivoted with the supporter (10) and capable of being mutually engaged with the supporter (10); and two connection bars (30, 40) arranged in parallel at two opposite sides of the supporter (10) and the corresponding supporter (20) capable of being mutually engaged, wherein two ends of the connection bar (30) are respectively pivoted with the one end of the supporter (10) and an opposite end of the corresponding supporter (20), and two ends of the other connection bar (40) are respectively pivoted with an opposite end of the supporter (10) and one end of the corresponding supporter (20) thereby allowing the corresponding supporter (20) and the connection bar (30) to respectively utilize one end of the supporter (10) as a rotation axis for being rotated and unfolded towards an end direction (D1) of the supporter (10), or allowing the corresponding supporter (20) and the other connection bar (40) to respectively utilize the opposite end of the supporter (10) as a rotation axis for being rotated and unfolded towards an opposite end direction (D2) of the supporter (10) so as to form the dual-directional opening operation.

The difference between the third embodiment and the first embodiment is that: a buckling structure (60) is additionally installed, which includes a buckle unit (61) and a corresponding buckle unit (62) matched with each other, the buckle unit (61) is disposed at one side of the supporter (10), and the corresponding buckle unit (62) is disposed at one side of the corresponding supporter (20), one end of the buckle unit (61) is detachably and rotatably buckled at an opposite end of the corresponding buckle unit (62), an opposite end of the buckle unit (61) is detachably and rotatably buckled at one end of the corresponding buckle unit (62); so when the corresponding supporter (20) is rotated and unfolded towards an end direction (D1), one end of the buckle unit (61) is able to be rotatably buckled at the opposite end of the corresponding buckle unit (62); when the corresponding supporter (20) is rotated and unfolded towards an opposite end direction (D2), the opposite end of the buckle unit (61) is able to be rotatably buckled at one end of the corresponding buckle unit (62).

According to the third embodiment, two opposite sides of the supporter (10) are respectively provided with a first bending sheet (11) and a second bending sheet (12), two opposite sides of the corresponding supporter (20) are respectively provided with a third bending sheet (21) and a fourth bending sheet (22), thereby generating a gap due to the mutual support provided by the supporter (10) and the corresponding supporter (20) when the corresponding supporter (20) being engaged with the supporter (10), and each of the connection bars (30, 40) is respectively parallel to the first and the third bending sheets (11, 21) and the second and the fourth bending sheets (12, 22), the buckling structure (60) is disposed between the first and the third bending sheets (11, 21) or between the second and the fourth bending sheets (12, 22); for allowing the two supporters to be staggeringly arranged, a pivotal shaft (50*a*, 50*b*, 50*c*, 50*d*) is respectively installed at the location where each of the connection bars (30, 40), the first bending sheet (11), the second bending sheet (12), the third bending sheet (21) and the fourth bending sheet (22) being pivoted, the four pivotal shafts (50*a*, 50*b*, 50*c*, 50*d*) are arranged with a means of every two being coaxial with each other, and the two coaxial pivotal shafts (50*b*, 50*c*) are parallel to the other two coaxial pivotal shafts (50*a*, 50*d*).

Figure 17:
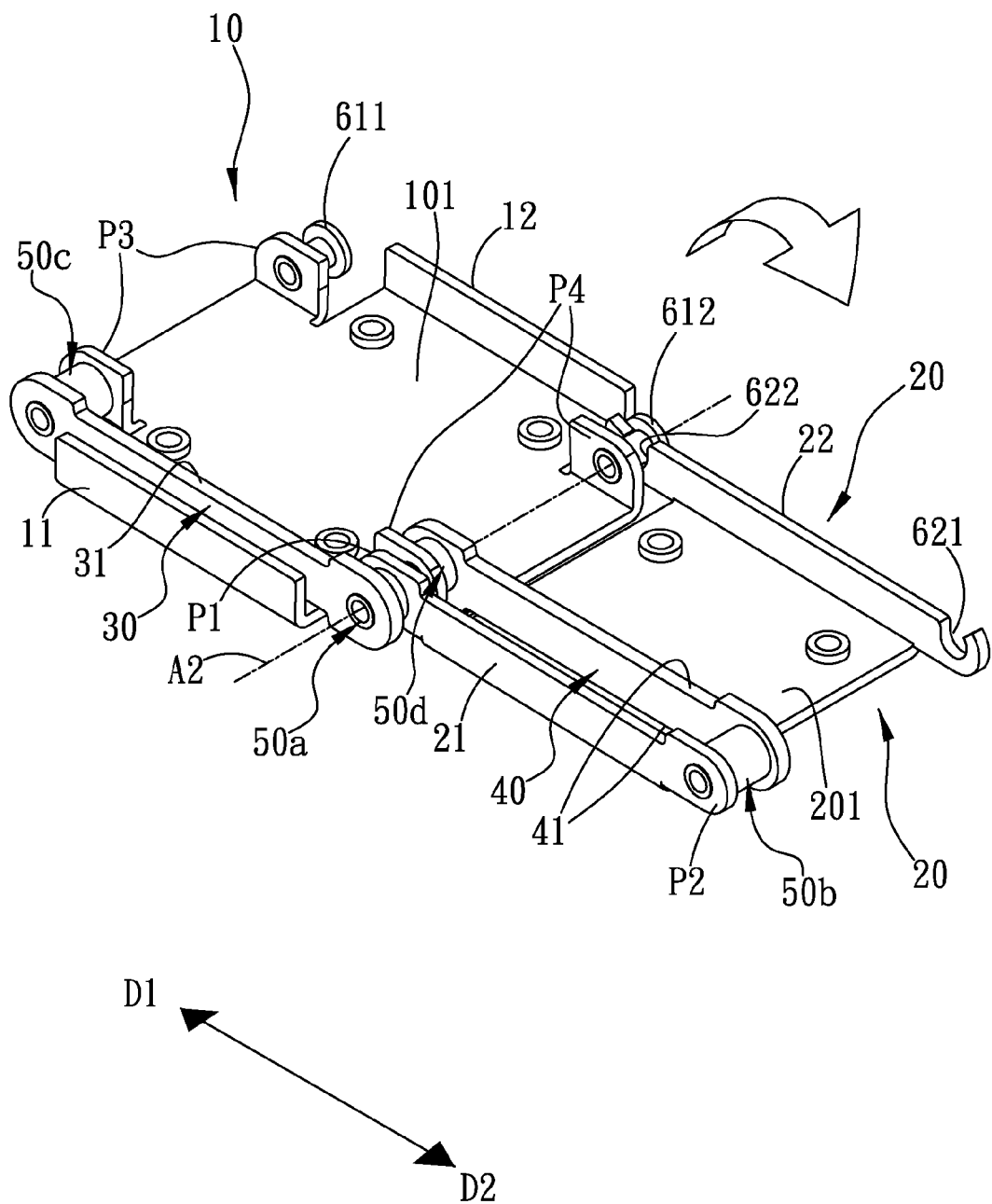
FIG. 17 is a perspective view illustrating an alternative of the buckling structure according to the third embodiment of the present invention.

One alternative of the third embodiment is that two ends of the buckle unit (61) are respectively formed with an axial convex part (611, 612), and two ends of the corresponding buckle unit (62) are respectively formed with a radial concave groove (621, 622), each of the radial concave grooves (621, 622) is respectively corresponding to each of the axial convex parts (612, 611) and detachably and rotatably buckled with each of the axial convex parts (611, 612); as shown in FIG. 17 which is an alternative of FIG. 11, the difference between the two figures is that the first and the second pivotal parts (P1, P2) are respectively disposed at two opposite ends at one side of the corresponding supporter (20), two ends of the other connection bar (40) are respectively pivoted with the pivotal lug at the left side of the fourth pivotal part (P4) and the second pivotal part (P2), so each of the axial convex parts (611, 612) is able to be served as a pivotal shaft and respectively disposed at two opposite ends at another side of the supporter (10) (i.e. each of the axial convex parts (611, 612) being respectively pivoted with the pivotal lug at the right side of the third pivotal part (P3) and at the right side of the fourth pivotal part (P4)), and each of the radial concave grooves (621, 622) is respectively disposed at two opposite ends at another side of the corresponding supporter (20) (i.e. the two opposite ends of the fourth bending sheet (22)), so when the corresponding supporter (20) is processed with the dual-directional opening operation relative to the supporter (10), the stable rotating motion of the corresponding supporter (20) can be ensured and an effect of rotation buckling is also provided.

Figure 14:
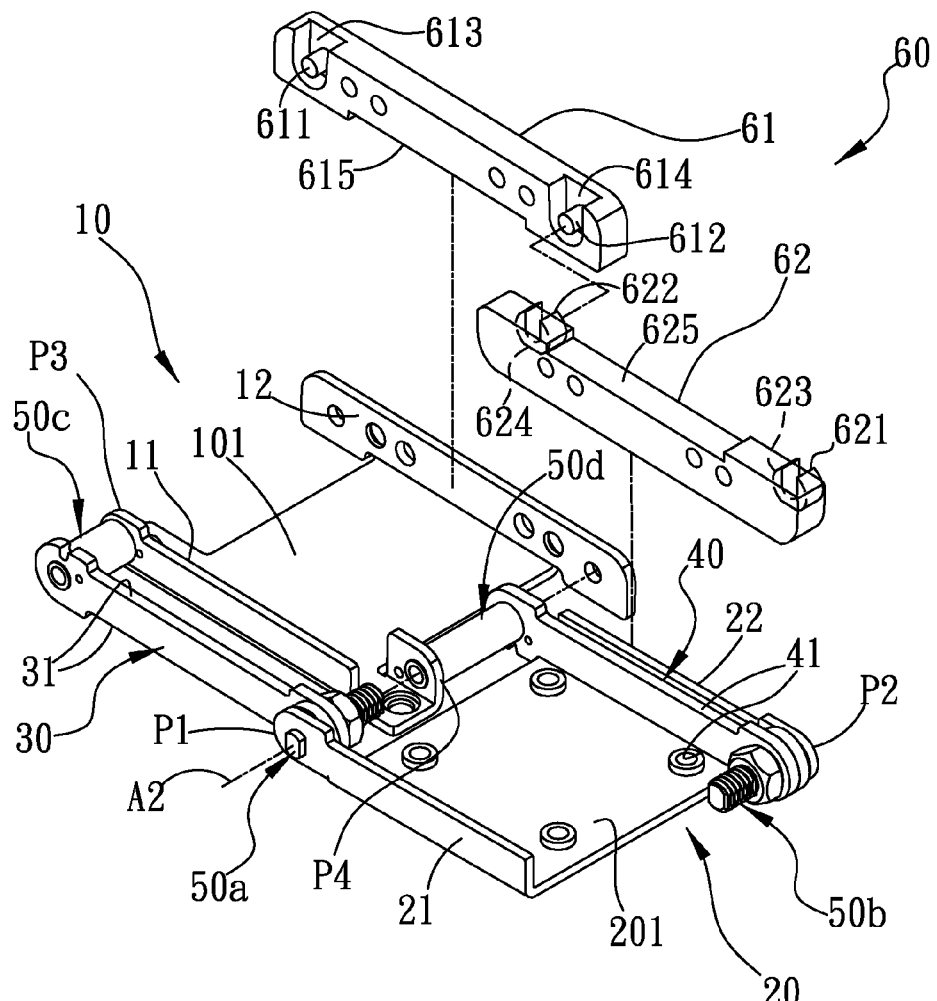
FIG. 14 is a perspective view illustrating a buckling structure being additionally installed according to the third embodiment of the present invention.
Figure 14A:
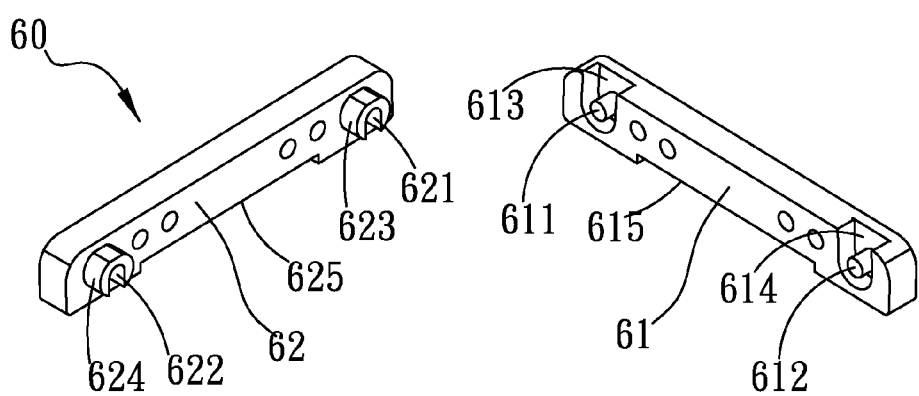
FIG. 14A is an exploded view illustrating the buckling structure shown in FIG. 14, wherein the status of the buckling structure being applied when the corresponding supporter being mutually engaged with the supporter.
Figure 15:
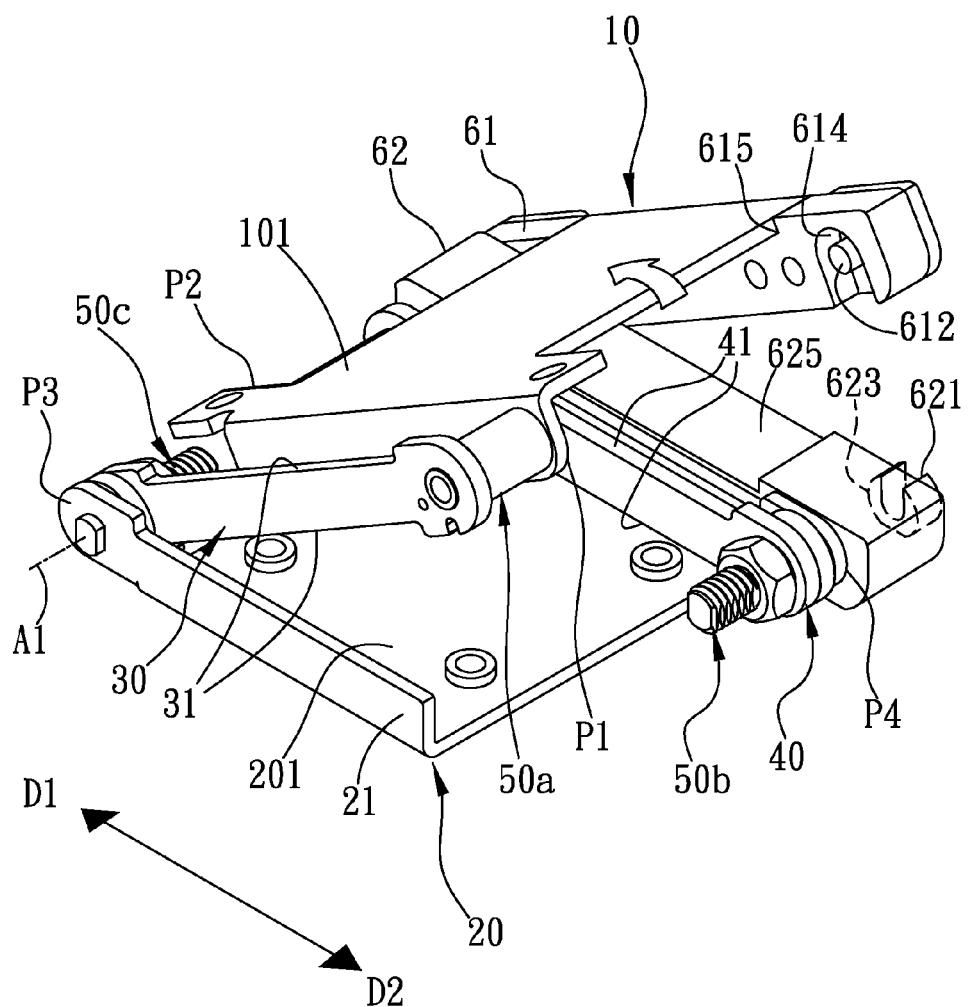
FIG. 15 is a schematic view illustrating the corresponding supporter being rotated and unfolded towards an end direction according to the third embodiment of the present invention.
Figure 16:
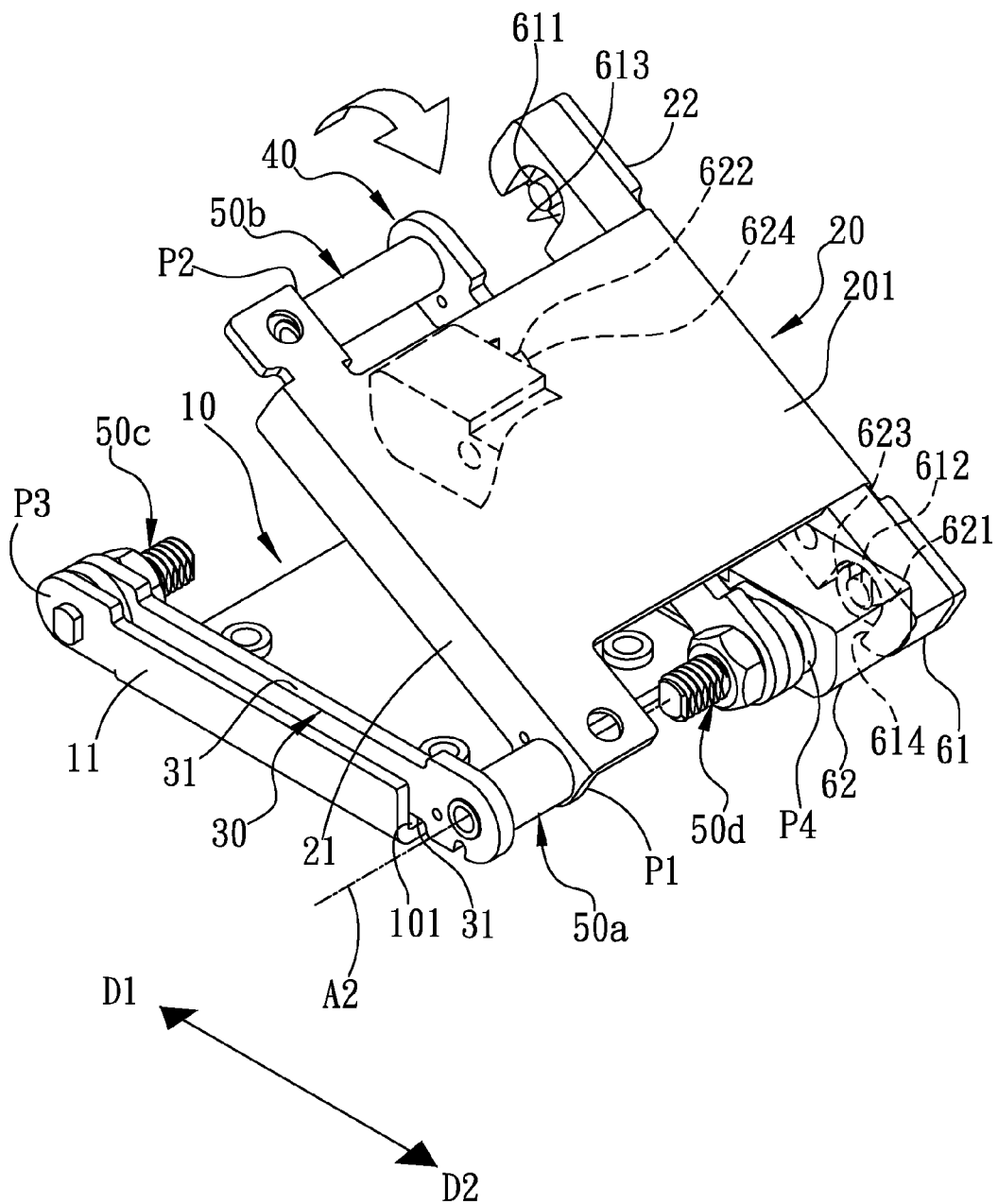
FIG. 16 is a schematic view illustrating the corresponding supporter being rotated and unfolded towards an opposite end direction according to the third embodiment of the present invention.

As shown from FIG. 14 to FIG. 16, two ends of the buckle unit (61) are respectively formed with a guiding recess (613, 614), each of the axial convex parts (611, 612) is respectively disposed in each of the guiding recesses (613, 614); two ends of the corresponding buckle unit (62) are respectively formed with a corresponding axial convex part (623, 624) corresponding to each of the axial convex parts (611, 612), each of the radial concave grooves (621, 622) is respectively disposed in each of the corresponding axial convex parts (623, 624), so each of the corresponding axial convex parts (623, 624) is able to be guided into each of the guiding recesses (613, 614), and each of the axial convex parts (611, 612) is able to be respectively guided into each of the radial concave grooves (621, 622), thereby allowing the corresponding buckle unit (62) to utilize one end or the opposite end of the buckle unit (61) as a rotation axis so as to form a rotation buckling status, the stable rotating operation of the corresponding supporter (20) can also be ensured; when the two supporters are mutually engaged, the axial convex part (611) at one end of the buckle unit (61) and the corresponding axial convex part (623) at the opposite end of the corresponding buckle unit (62) are located at the same axial line (A1) as the second and the third pivotal parts (P2, P3), the axial convex part (612) at the opposite end of the buckle unit (61) and the corresponding axial convex part (624) at one end of the corresponding buckle unit (62) are located at the same axial line (A2) as the first and the fourth pivotal parts (P1, P4); when the corresponding supporter (20) is rotated and unfolded towards the end direction (D1) (as shown in FIG. 15), the corresponding axial convex part (624) at the opposite end of the corresponding buckle unit (62) is released from the guiding recess (614) at the opposite end of the buckle unit (61), the corresponding axial convex part (623) at one end of the corresponding buckle unit (62) is guided into the guiding recess (613) at one end of the buckle unit (61) and buckled with the axial convex part (611) for rotating; when the corresponding supporter (20) is rotated and unfolded towards the opposite end direction (D2) (as shown in FIG. 16), the corresponding axial convex part (623) at one end of the corresponding buckle unit (62) is released from the guiding recess (613) at one end of the buckle unit (61), the corresponding axial convex part (624) at the opposite end of the corresponding buckle unit (62) is guided into the guiding recess (614) at the opposite end of the buckle unit (61) and buckled with the axial convex part (612) for rotating.

A positioning recess (615, 625) is further formed between two ends of the buckle unit (61) and between two ends of the corresponding buckle unit (62), the supporter main body (101) or the corresponding supporter main body (201) is able to be positioned in each of the positioning recesses (615, 625), so when the whole buckling structure (60) is installed at the one side of the supporter (10) and the corresponding supporter (20) capable of being mutually engaged, the effect of being thinner can still be provided.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific examples of the embodiments disclosed and that modifications and other embodiments are intended to be included within the scope of the appended claims. Although specific terms are employed herein, they are used in a generic and descriptive sense only and not for purposes of limitation.

What is claimed is:

1. A connecting device capable of opening and engaging in dual directions, including:
   a supporter, having two opposite ends respectively installed with a third pivotal part and a fourth pivotal part;
   a corresponding supporter, capable of being engaged with said supporter, two opposite ends of said corresponding supporter being respectively installed with a first pivotal part and a second pivotal part; and
   two connection bars including a first connection bar and a second connection bar, said first connection bar and said second connection bar are parallel when said connecting device is located in a closed position, two ends of said first connection bar being respectively pivotally connected with said first pivotal part and said third pivotal part, two ends of said second connection bar being respectively pivotally connected with said second pivotal part and said fourth pivotal part, so said corresponding supporter and said first connection bar being allowed to respectively utilize said second and said third pivotal parts as a rotation axis for being rotated and unfolded towards an end direction of said supporter, or said corresponding supporter and said second connection bar being allowed to respectively utilize said first and said fourth pivotal parts as a rotation axis for being rotated and unfolded towards an opposite end direction of said supporter, thereby forming the dual-directional opening operation.

2. The connecting device capable of opening and engaging in dual directions according to claim 1, wherein said first pivotal part and said second pivotal part are respectively extended from two opposite corners of said corresponding supporter, said third pivotal part and said fourth pivotal part are respectively extended from two opposite corners of said supporter; said two connection bars, said first pivotal part and said second pivotal part of said corresponding supporter and said third pivotal part and said fourth pivotal part of said supporter are parallel when said connecting device is located in said closed position, and two ends of said first connection bar are respectively aligned with said first pivotal part and said second pivotal part, and two ends of said second connection bar are respectively aligned with said third pivotal part and said fourth pivotal part, thereby enabling said second and said third pivotal parts to be at an axial line and said first and said fourth pivotal parts to be at another axial line.

3. The connecting device capable of opening and engaging in dual directions according to claim 1, wherein two opposite sides of said supporter are respectively provided with a first bending sheet and a second bending sheet, two opposite sides of said corresponding supporter are respectively provided with a third bending sheet and a fourth bending sheet, wherein a hollow interior is formed between said supporter and said corresponding supporter when said corresponding supporter is positioned above said supporter.

4. The connecting device capable of opening and engaging in dual directions according to claim 3, wherein a main body of said supporter made of a sheet material and a main body of said corresponding supporter are respectively formed between two opposite ends of said supporter and two opposite ends of said corresponding supporter, a concave part is respectively formed between two ends of each of said connection bars, thereby forming a status of each bar end being wider and the mid bar body being narrower, each of said main bodies is able to be respectively mounted and positioned in each of said concave parts, thereby enabling each of said connection bars to be respectively adjacent and abutted against said supporter and said corresponding supporter.

5. The connecting device capable of opening and engaging in dual directions according to claim 1, wherein a pivotal shaft is respectively installed between said first connection bar and said first pivotal part and between said second connection bar and said second pivotal part, said pivotal shafts are perpendicular to the two connection bars, thereby enabling said corresponding supporter to be horizontally displaced in the axial direction relative to said supporter.

6. The connecting device capable of opening and engaging in dual directions according to claim 5, wherein each of said pivotal shafts includes an axial core member and a fasten member pivotally connected to each other, two ends of said axial core member are respectively formed as a stop part and a connection part, said fasten member is correspondingly pivotally connected with said connection part.

7. The connecting device capable of opening and engaging in dual directions according to claim 1, wherein a pivotal shaft is respectively installed between said first connection bar and said third pivotal part and between said second connection bar and said fourth pivotal part, said pivotal shafts are perpendicular to the two connection bars, thereby enabling said supporter to be horizontally displaced in the axial direction relative to said corresponding supporter.

8. The connecting device capable of opening and engaging in dual directions according to claim 7, wherein each of said pivotal shafts includes an axial core member and a fasten member pivotally connected to each other, two ends of said axial core member are respectively formed as a stop part and a connection part, said fasten member is correspondingly pivotally connected with said connection part.

9. A connecting device capable of opening and engaging in dual directions, including:
   a supporter, installed with a third pivotal part and a fourth pivotal part arranged with an interval on a main body thereof;
   a corresponding supporter, pivotally connected with said supporter and capable of being mutually engaged, and installed with a first pivotal part and a second pivotal part arranged with an interval on a main body thereof; and
   two connection bars disposed between said supporter and said corresponding supporter capable of being mutually engaged, said two connection bars including a first connection bar and a second connection bar, said first connection bar and said second connection bar are parallel when said connecting device is located in a closed position, wherein two ends of said first connection bar being respectively pivotally connected with said first pivotal part and said third pivotal part, two ends of said second connection bar being respectively pivotally connected with said second pivotal part and said fourth pivotal part, so said corresponding supporter and said first connection bar being allowed to respectively utilize said second and said third pivotal parts as a rotation axis for being rotated and unfolded towards an end direction of said supporter, or said corresponding supporter and said second connection bar being allowed to respectively utilize said first and said fourth pivotal parts as a rotation axis for being rotated and unfolded towards an opposite end direction of said supporter, thereby forming the dual-directional opening operation.

10. The connecting device capable of opening and engaging in dual directions according to claim 9, wherein two opposite sides of said supporter are respectively provided with a first bending sheet and a second bending sheet, two opposite sides of said corresponding supporter are respectively provided with a third bending sheet and a fourth bending sheet, wherein a hollow interior is formed between said supporter and said corresponding supporter when said corresponding supporter is positioned above said supporter, each of said connection bars is respectively parallel to said first and said third bending sheets and said second and said fourth bending sheets when said connecting device is located in said closed position.

11. The connecting device capable of opening and engaging in dual directions according to claim 10, wherein a pivotal shaft is respectively installed at the location where each of said connection bars, said first bending sheet, said second bending sheet, said third bending sheet and said fourth bending sheet are pivotally connected, said four pivotal shafts are arranged with a means of every two being coaxial with each other, and said two coaxial pivotal shafts are parallel to said other two coaxial pivotal shafts when said connecting device is located in said closed position.

12. The connecting device capable of opening and engaging in dual directions according to claim 10, wherein said main body of said supporter made of a sheet material and said main body of said corresponding supporter are respectively formed between two opposite ends of said supporter and two opposite ends of said corresponding supporter, a concave part is respectively formed between two ends of each of said connection bars, thereby forming a status of each bar end being wider and the mid bar body being narrower, each of said main bodies is able to be respectively mounted and positioned in each of said concave parts, thereby enabling each of said connection bars to be respectively adjacent and abutted against said supporter and said corresponding supporter.

13. A connecting device capable of opening and engaging in dual directions, including:
 a supporter, installed with a third pivotal part and a fourth pivotal part arranged with an interval;
 a corresponding supporter, pivotally connected with said supporter and capable of being mutually engaged, and installed with a first pivotal part and a second pivotal part arranged with an interval;
 two hinges, parallel to each other and horizontally disposed at two opposite sides of said supporter or said corresponding supporter, so each of said hinges being respectively disposed at said third pivotal part and said fourth pivotal part, or each of said hinges being respectively disposed at said first pivotal part and said second pivotal part; and
 two connection bars horizontally disposed at two opposite sides of said supporter and said corresponding supporter capable of being mutually engaged, said two connection bars including a first connection bar and a second connection bar, said first connection bar and said second connection bar are parallel when said connecting device is located in a closed position, wherein two ends of said first connection bar being respectively pivotally connected with said first pivotal part and said third pivotal part, two ends of said second connection bar being respectively pivotally connected with said second pivotal part and said fourth pivotal part, so said corresponding supporter and said first connection bar being allowed to respectively utilize said second and said third pivotal parts as a rotation axis for being rotated and unfolded towards an end direction of said supporter so as to generate a first torque variation, or said corresponding supporter and said second connection bar being allowed to respectively utilize said first and said fourth pivotal parts as a rotation axis for being rotated and unfolded towards an opposite end direction of said supporter so as to generate a second torque variation, thereby providing the torque variation to the dual-directional opening operation.

14. The connecting device capable of opening and engaging in dual directions according to claim 13, wherein two opposite sides of said supporter are respectively provided with a first bending sheet and a second bending sheet, two opposite sides of said corresponding supporter are respectively provided with a third bending sheet and a fourth bending sheet, wherein a hollow interior is formed between said supporter and said corresponding supporter when said corresponding supporter is positioned above said supporter, each of said connection bars is respectively parallel to said first and said third bending sheets and said second and said fourth bending sheets when said connecting device is located in said closed position; each of said hinges is disposed at the location where each of said connection bars being pivotally connected with said first bending sheet and said second bending sheet, or at the location where each of said connection bars being pivotally connected with said third bending sheet and said fourth bending sheet.

15. The connecting device capable of opening and engaging in dual directions according to claim 14, wherein each of said hinges includes a pivotal shaft and a torsion spring sleeved on said pivotal shaft, each of said torsion springs is provided with a preset elasticity and one end thereof is respectively positioned in each of said pivotal parts, the other end of each of said torsion springs is respectively positioned at a bar end of each of said connection bars.

16. The connecting device capable of opening and engaging in dual directions according to claim 14, wherein each of said hinges includes a pivotal shaft and at least a cam and at least an elastic member sleeved on said pivotal shaft, said at least one cam includes a mobile cam and a fixed cam capable of mutually pressing and pushing, the surfaces where said mobile cam being in contact with said fixed cam are respectively formed as a convex/concave surface, said at least one elastic member includes plural disc-shaped elastic sheets stacked with each other.

17. The connecting device capable of opening and engaging in dual directions according to claim 14, wherein each of said hinges includes a pivotal shaft and a covering structure sleeved on said pivotal shaft, each of said covering structures is formed as a covering cylinder having an axial opening, and each of said covering structures is combined on said supporter or said corresponding supporter.

18. The connecting device capable of opening and engaging in dual directions according to claim 14, wherein a main body of said supporter made of a sheet material and a main body of said corresponding supporter are respectively formed between two opposite ends of said supporter and two opposite ends of said corresponding supporter, a concave part is respectively formed between two ends of each of said connection bars, thereby forming a status of each bar end being wider and the mid bar body being narrower, each of said main bodies is able to be respectively mounted and positioned in each of said concave parts, thereby enabling each of said connection bars to be respectively adjacent and abutted against said supporter and said corresponding supporter.

19. A connecting device capable of opening and engaging in dual directions, including:
- a supporter;
- a corresponding supporter, pivotally connected with said supporter and capable of being mutually engaged;
- a buckling structure, including a buckle unit and a corresponding buckle unit matched with each other, said buckle unit being disposed at one side of said supporter, and said corresponding buckle unit being disposed at one side of said corresponding supporter, one end of said buckle unit being detachably and rotatably buckled at an opposite end of said corresponding buckle unit, an opposite end of said buckle unit being detachably and rotatably buckled at one end of said corresponding buckle unit; and
- two connection bars disposed at two opposite sides of said supporter and said corresponding supporter capable of being mutually engaged, said two connection bars including a first connection bar and a second connection bar, said first connection bar and said second connection bar are parallel when said connecting device is located in a closed position, wherein two ends of said first connection bar being respectively pivotally connected with one end of said supporter and an opposite end of said corresponding supporter, two ends of said second connection bar being respectively pivotally connected with an opposite end of said supporter and one end of said corresponding supporter, so when said corresponding supporter and said first connection bar being rotated and unfolded towards an end direction of said supporter, one end of said buckle unit being able to be rotatably buckled at the opposite end of said corresponding buckle unit, or when said corresponding supporter and said second connection bar being rotated and unfolded towards an opposite end direction of said supporter, the opposite end of said buckle unit being able to be rotatably buckled at one end of said corresponding buckle unit, thereby forming the dual-directional opening operation.

20. The connecting device capable of opening and engaging in dual directions according to claim 19, wherein two opposite sides of said supporter are respectively provided with a first bending sheet and a second bending sheet, two opposite sides of said corresponding supporter are respectively provided with a third bending sheet and a fourth bending sheet, wherein a hollow interior is formed between said supporter and said corresponding supporter when said corresponding supporter is positioned above said supporter, each of said connection bars is respectively parallel to said first and said third bending sheets and said second and said fourth bending sheets when said connecting device is located in said closed position.

21. The connecting device capable of opening and engaging in dual directions according to claim 20, wherein a pivotal shaft is respectively installed at the location where each of said connection bars, said first bending sheet, said second bending sheet, said third bending sheet and said fourth bending sheet are pivotally connected, said four pivotal shafts are arranged with a means of every two being coaxial with each other, and said two coaxial pivotal shafts are parallel to said other two coaxial pivotal shafts when said connecting device is located in said closed position.

22. The connecting device capable of opening and engaging in dual directions according to claim 20, wherein a main body of said supporter made of a sheet material and a main body of said corresponding supporter are respectively formed between two opposite ends of said supporter and two opposite ends of said corresponding supporter, a concave part is respectively formed between two ends of each of said connection bars, thereby forming a status of each bar end being wider and the mid bar body being narrower, each of said main bodies is able to be respectively mounted and positioned in each of said concave parts, thereby enabling each of said connection bars to be respectively adjacent and abutted against said supporter and said corresponding supporter.

23. The connecting device capable of opening and engaging in dual directions according to claim 19, wherein two ends of said buckle unit are respectively formed with an axial convex part, and two ends of said corresponding buckle unit are respectively formed with a radial concave groove, each of said radial concave grooves is respectively corresponding to each of said axial convex parts and detachably and rotatably buckled with each of said axial convex parts.

24. The connecting device capable of opening and engaging in dual directions according to claim 23, wherein two ends of said buckle unit are respectively formed with a guiding recess, each of said axial convex parts is respectively disposed in each of said guiding recesses; two ends of said corresponding buckle unit are respectively formed with a corresponding axial convex part corresponding to each of said axial convex parts, each of said radial concave grooves is respectively disposed in each of said corresponding axial convex parts, so each of said corresponding axial convex parts is able to be guided into each of said guiding recesses, and each of said axial convex parts is able to be respectively guided into each of said radial concave grooves, thereby allowing said corresponding buckle unit to utilize one end or the opposite end of said buckle unit as a rotation axis so as to form a rotation buckling status.

25. The connecting device capable of opening and engaging in dual directions according to claim 24, wherein a positioning recess is further formed between two ends of said buckle unit and between two ends of said corresponding buckle unit, a supporter main body or a corresponding supporter main body is able to be positioned in each of said positioning recesses.

\* \* \* \* \*